(12) United States Patent
Naohara et al.

(10) Patent No.: US 10,985,038 B2
(45) Date of Patent: Apr. 20, 2021

(54) DETERMINATION METHOD AND SUBSTRATE PROCESSING EQUIPMENT

(71) Applicant: SCREEN Holdings Co., Ltd., Kyoto (JP)

(72) Inventors: Hideji Naohara, Kyoto (JP); Hiroaki Kakuma, Kyoto (JP); Yuji Okita, Kyoto (JP); Tatsuya Masui, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 213 days.

(21) Appl. No.: 16/200,673

(22) Filed: Nov. 27, 2018

(65) Prior Publication Data

US 2019/0172732 A1 Jun. 6, 2019

(30) Foreign Application Priority Data

Dec. 4, 2017 (JP) .............................. JP2017-232494

(51) Int. Cl.
| | |
|---|---|
| *G06K 9/00* | (2006.01) |
| *C03C 15/00* | (2006.01) |
| *H01L 21/67* | (2006.01) |
| *H01L 21/02* | (2006.01) |

(Continued)

(52) U.S. Cl.
CPC .. *H01L 21/67051* (2013.01); *H01L 21/02054* (2013.01); *H01L 21/02057* (2013.01); *H01L 21/02082* (2013.01); *H01L 21/6708* (2013.01); *H01L 21/67028* (2013.01); *H01L 21/67034* (2013.01); *H01L 21/67103* (2013.01); *H01L 21/67253* (2013.01); *H01L 21/67288* (2013.01); *H01L 21/6875* (2013.01); *H01L 21/68721* (2013.01); *H01L 21/68742* (2013.01); *H01L 22/12* (2013.01); *H01L 22/20* (2013.01)

(58) Field of Classification Search
USPC ....... 382/100, 103, 106, 145, 162, 168, 173, 382/181, 209, 219, 232, 254, 276, 312, 382/141, 172; 216/85; 156/345.17; 134/18; 348/135
See application file for complete search history.

(56) References Cited

U.S. PATENT DOCUMENTS

| 10,249,487 B2 | 4/2019 | Okutani et al. |
| 10,475,670 B2 | 11/2019 | Yoshihara et al. |

(Continued)

FOREIGN PATENT DOCUMENTS

| CN | 105826219 | 8/2016 |
| JP | H04107946 | 4/1992 |

(Continued)

*Primary Examiner* — Seyed H Azarian
(74) *Attorney, Agent, or Firm* — JCIPRNET

(57) ABSTRACT

In equipment that executes a drying process of forming a liquid membrane on a top surface of a substrate W which is held horizontally and gradually enlarging a dry area from which the liquid membrane has been removed, quality of the drying process is determined. Specifically, first, the top surface of the substrate is repeatedly imaged by an imaging unit during execution of the drying process. Then, it is determined whether the dry area is in a normal state based on a plurality of captured images acquired by the imaging. Accordingly, it is possible to quantitatively determine whether a dry area is in a normal state based on a plurality of captured images.

22 Claims, 19 Drawing Sheets

(51) Int. Cl.
*H01L 21/687* (2006.01)
*H01L 21/66* (2006.01)

(56) References Cited

U.S. PATENT DOCUMENTS

| | | | |
|---|---|---|---|
| 2015/0235368 A1* | 8/2015 | Kakuma | G06T 7/73 |
| | | | 348/135 |
| 2015/0262848 A1* | 9/2015 | Sano | H01L 21/6715 |
| | | | 156/345.17 |
| 2015/0270146 A1* | 9/2015 | Yoshihara | H01L 21/68742 |
| | | | 134/18 |
| 2016/0089688 A1* | 3/2016 | Uemae | H01L 21/67051 |
| | | | 216/85 |
| 2016/0214148 A1* | 7/2016 | Okutani | H01L 21/68742 |
| 2019/0172703 A1 | 6/2019 | Okutani et al. | |
| 2020/0035514 A1 | 1/2020 | Yoshihara et al. | |

FOREIGN PATENT DOCUMENTS

| | | |
|---|---|---|
| JP | 2009027608 | 2/2009 |
| JP | 2016162847 | 9/2016 |
| KR | 20150109260 | 10/2015 |

\* cited by examiner

DETERMINATION METHOD AND SUBSTRATE PROCESSING EQUIPMENT

CROSS-REFERENCE TO RELATED APPLICATION

This application corresponds to Japanese Patent Application No. 2017-232494 filed with the Japan Patent Office on Dec. 4, 2017, the entire disclosure of which is incorporated herein by reference.

BACKGROUND

Technical Field

The disclosure relates to a technique for determining quality of a substrate drying process in equipment which is used for a process of manufacturing a sheet-shaped substrate such as a semiconductor wafer.

Description of Related Art

In a process of manufacturing a semiconductor wafer, a process of drying a substrate is performed after various processing liquids have been supplied to the substrate. In the related art, in the process of drying a substrate, a so-called spin drying method of removing droplets attached to the surface of a substrate by causing the substrate to rotate at a high speed while holding the substrate horizontally is performed. However, recently, a decrease in size of patterns which are formed on the surface of a semiconductor wafer has progressed. Accordingly, in the spin drying method, there is a problem in that fine patterns collapse due to a centrifugal force applied to a substrate.

Therefore, various methods for drying a substrate while preventing collapse of patterns have been proposed. One thereof is described in Japanese Patent Application Laid-Open No. 2016-162847. In the method described in the publication, first, an organic solvent having low surface tension is supplied to the surface of a substrate after the surface of the substrate has been subjected to a rinse process using pure water (DIW). Accordingly, pure water on the top surface of the substrate is replaced with the organic solvent to form a liquid membrane of the organic solvent on the top surface of the substrate. Then, a vapor layer is formed between the top surface of the substrate and the liquid membrane by heating the substrate. Thereafter, a dry area from which the liquid membrane has been removed is formed in a part of the top surface of the substrate by blowing an inert gas onto the top surface of the substrate. Then, the substrate is dried by gradually enlarging the dry area using the inert gas (see Paragraphs 0084 to 0089).

In the method described in the publication, the liquid membrane can be removed while forming a vapor layer between the top surface of the substrate and the liquid membrane of the organic solvent. Accordingly, stress is not easily applied to patterns formed on the top surface of the substrate at the time of removing the liquid membrane. As a result, it is possible to prevent collapse of patterns at the time of drying.

However, in the drying method described in the publication, when the substrate is heated to form a vapor layer between the top surface of the substrate and the liquid membrane, fine bubbles are generated in the liquid membrane. Accordingly, an opening may be formed in a part of the liquid membrane. When an opening is formed in the liquid membrane before an inert gas is discharged, vapor between the top surface of the substrate and the liquid membrane leaks through the opening. Accordingly, it is not possible to maintain a vapor layer.

When the dry area is enlarged with an inert gas after the dry area has been formed in a part of the top surface of the substrate, the shape of the dry area may collapse or a plurality of dry areas may be formed.

With the drying method described in Japanese Patent Application Laid-Open No. 2016-162847, as described above, it is difficult to form and enlarge the dry area as intended. Accordingly, for the purpose of quality control of a substrate, it is necessary to accurately ascertain whether a dry area is formed and enlarged as intended in the drying process.

SUMMARY

The disclosure provides a determination method and substrate processing equipment that can quantitatively determine whether a dry area is in a normal state.

According to the disclosure, there is provided a determination method of determining quality of a drying process in equipment that executes the drying process of forming a liquid membrane on a top surface of a substrate which is held horizontally and gradually enlarging a dry area from which the liquid membrane has been removed, the determination method including: a) repeatedly imaging the top surface of the substrate during execution of the drying process; and b) determining whether the dry area is in a normal state based on a plurality of captured images acquired in the step of a).

According to the disclosure, there is provided substrate processing equipment including: a substrate holding unit configured to hold a substrate horizontally; a liquid membrane forming unit configured to form a liquid membrane on a top surface of the substrate which is held by the substrate holding unit; a first drying unit configured to initially form a dry area from which the liquid membrane has been removed at a predetermined position of the top surface of the substrate; a second drying unit configured to gradually enlarge the dry area; an imaging unit configured to repeatedly image the top surface of the substrate; and a determination unit configured to determine whether the dry area is in a normal state based on a plurality of captured images acquired by the imaging unit.

According to the disclosure, it is possible to quantitatively determine whether a dry area is in a normal state based on a plurality of captured images.

DESCRIPTION OF THE EMBODIMENTS

Hereinafter, an embodiment of the disclosure will be described in detail with reference to the accompanying drawings.

1. Whole Configuration of Substrate Processing Equipment

Figure 1:
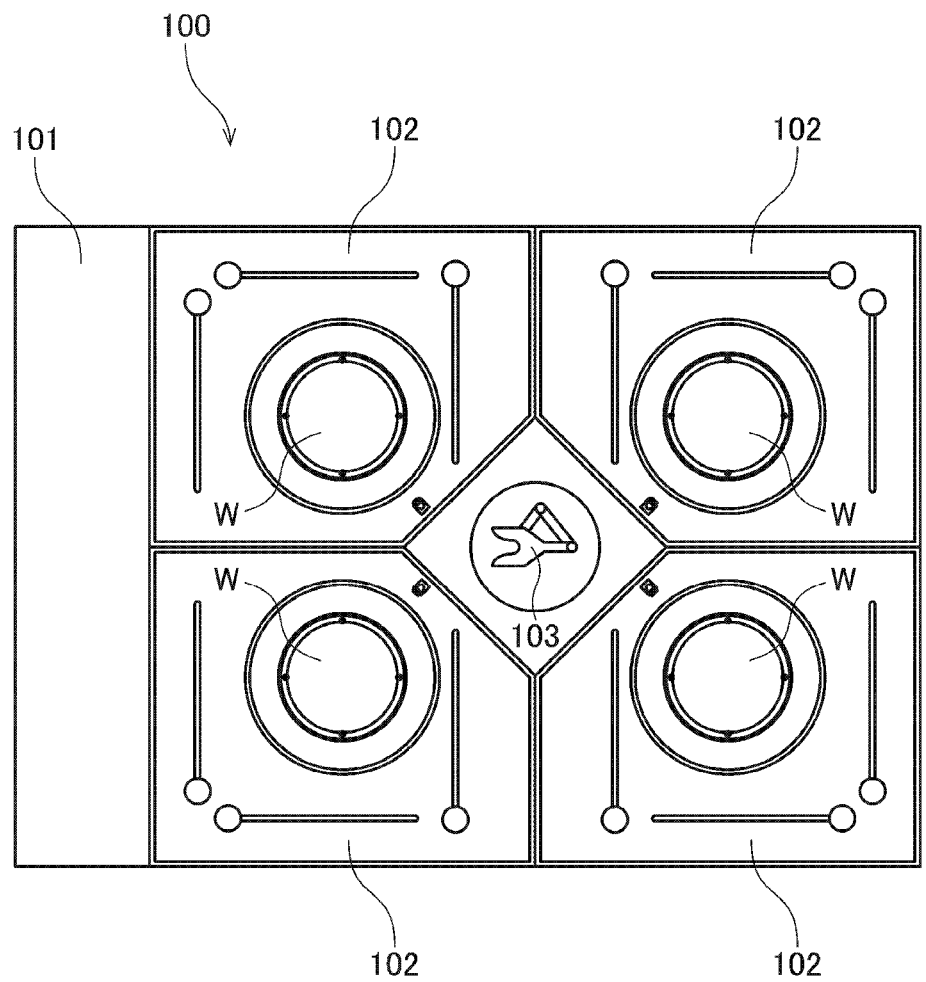
FIG. 1 is a plan view of substrate processing equipment.

FIG. 1 is a plan view of substrate processing equipment 100 according to an embodiment of the disclosure. The substrate processing equipment 100 is equipment that processes a surface of a disc-shaped substrate W (a silicon wafer) in the process of manufacturing a semiconductor wafer. The substrate processing equipment 100 performs a liquid process of supplying a processing liquid to the surface of a substrate W and a drying process of drying the surface of the substrate W.

As illustrated in FIG. 1, the substrate processing equipment 100 includes an indexer 101, a plurality of processing units 102, and a main delivery robot 103.

The indexer 101 is a part that is used to load a non-processed substrate W from the outside and to unload a processed substrate W to the outside. A plurality of carriers that accommodate a plurality of substrates W are disposed in the indexer 101. The indexer 101 includes a transfer robot which is not illustrated. The transfer robot transfers a substrate W between a carrier in the indexer 101 and the processing unit 102 or the main delivery robot 103. For example, a known front opening unified pod (FOUP) or a standard mechanical interface (SMIF) pod that accommodates a substrate W in a closed space or an open cassette (OC) in which a received substrate W comes in contact with outside air is used as the carrier.

The processing unit 102 is a so-called single-wafer processing unit that processes a substrate W sheet by sheet. A plurality of processing units 102 are disposed around the main delivery robot 103. In this embodiment, four processing units 102 disposed around the main delivery robot 103 are stacked in three stages in the height direction. That is, the substrate processing equipment 100 according to this embodiment includes a total of 12 processing units 102. A plurality of substrates W are processed in parallel by each processing unit 102. The number of processing units 102 in the substrate processing equipment 100 is not limited to 12 and may be, for example, 8, 4, or 1.

The main delivery robot 103 is a mechanism that delivers a substrate W between the indexer 101 and the plurality of processing units 102. The main delivery robot 103 includes, for example, a hand that holds a substrate W and an arm that moves the hand. The main delivery robot 103 takes out a non-processed substrate W from the indexer 101 and delivers the substrate W to one processing unit 102. When processing of the substrate W in the processing unit 102 has been completed, the main delivery robot 103 takes out the processed substrate W from the processing unit 102 and delivers the substrate W to the indexer 101.

2. Configuration of Processing Unit

A configuration of the processing unit 102 will be described below. One of the plurality of processing units 102 in the substrate processing equipment 100 will be described below and the other processing units 102 have the same configuration.

Figure 2:
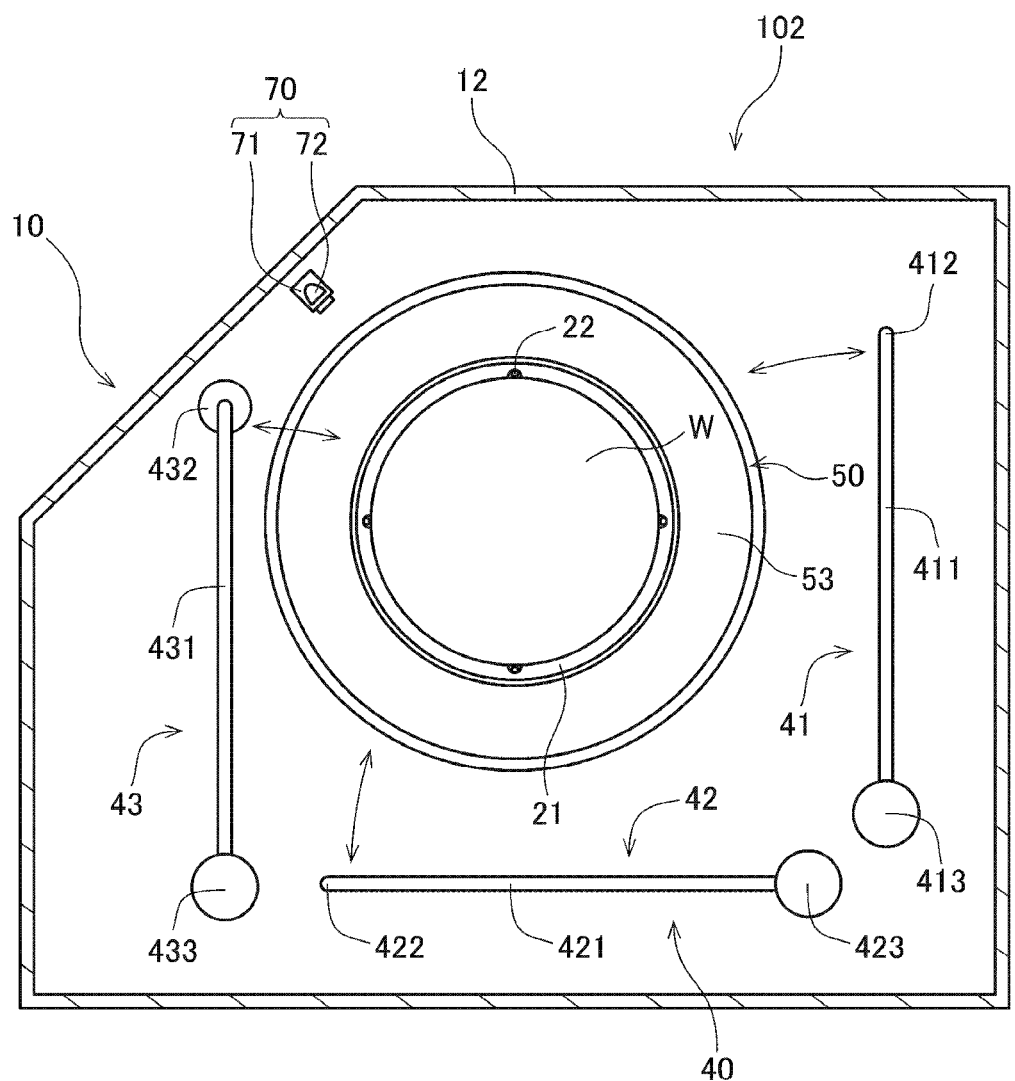
FIG. 2 is a plan view of a processing unit.
Figure 3:
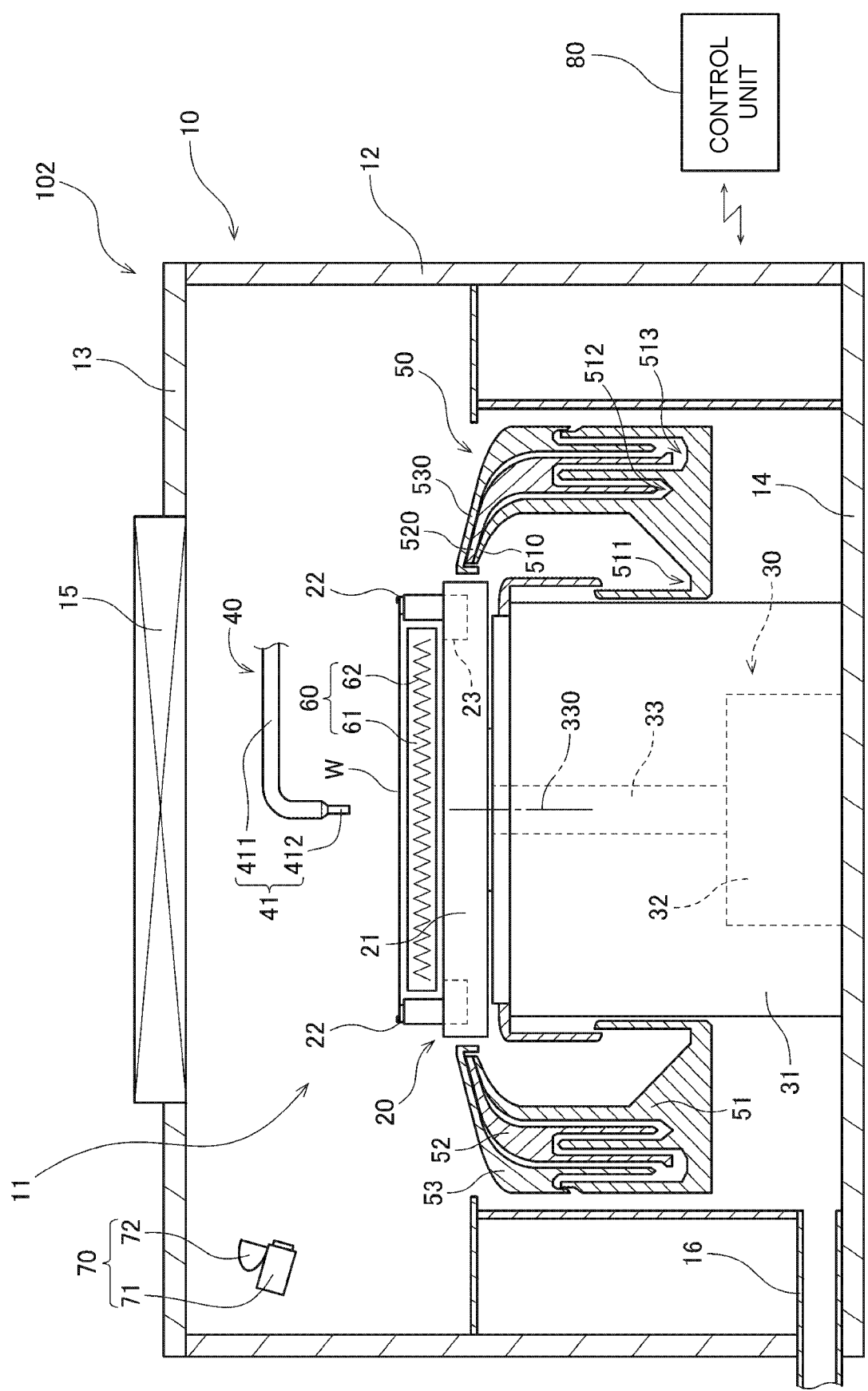
FIG. 3 is a longitudinal sectional view of the processing unit.

FIG. 2 is a plan view of a processing unit 102. FIG. 3 is a longitudinal sectional view of the processing unit 102. As illustrated in FIGS. 2 and 3, the processing unit 102 includes a chamber 10, a substrate holding unit 20, a rotation mechanism 30, a fluid supply unit 40, a processing liquid collecting unit 50, a heating unit 60, an imaging unit 70, and a control unit 80.

The chamber 10 is a casing having a processing space 11 for processing a substrate W therein. The chamber 10 includes a side wall 12 that surrounds sides of the processing space 11, a top plate portion 13 that covers the top of the processing space 11, and a bottom plate portion 14 that covers the bottom of the processing space 11. The substrate holding unit 20, the rotation mechanism 30, the fluid supply unit 40, the processing liquid collecting unit 50, the heating unit 60, and the imaging unit 70 are accommodated in the chamber 10. A loading/unloading port through which loading of a substrate W into the chamber 10 and unloading of a substrate W from the chamber 10 are performed and a shutter that opens and closes the loading/unloading port (neither of which is illustrated) are provided in a part of the side wall 12.

As illustrated in FIG. 3, a fan filter unit (FFU) 15 is provided in the top plate portion 13 of the chamber 10. The fan filter unit 15 includes a dust collection filter such as an HEPA filter and a fan that generates an air flow. When the fan filter unit 15 is activated, air in a clean room in which the substrate processing equipment 100 is installed is taken into the fan filter unit 15, is cleaned by the dust collection filter, and is supplied to the processing space 11 in the chamber 10. Accordingly, a downflow of clean air is formed in the processing space 11 in the chamber 10.

An exhaust duct 16 is connected to a part of the lower portion of the side wall 12. Air supplied from the fan filter unit 15 forms a downflow inside the chamber 10 and then is discharged to the outside of the chamber 10 via the exhaust duct 16.

The substrate holding unit 20 is a mechanism that holds a substrate W horizontally (in a posture in which a normal line is parallel to the vertical direction) in the chamber 10. As illustrated in FIGS. 2 and 3, the substrate holding unit 20 includes a disc-shaped spin base 21 and a plurality of chuck pins 22. The plurality of chuck pins 22 are provided at equal angle intervals along the outer circumferential portion of the top surface of the spin base 21. A substrate W is held by the plurality of chuck pins 22 in a state in which a processed surface on which patterns are formed faces the upper side. The chuck pins 22 come into contact with a bottom surface and an outer circumferential end face of the edge of the substrate W and support the substrate W at a position above the top surface of the spin base 21 with a gap therebetween.

A chuck pin switching mechanism 23 that switches positions of the plurality of chuck pins 22 is provided in the spin base 21. The chuck pin switching mechanism 23 switches the plurality of chuck pins 22 between a holding position at which a substrate W is held and a releasing position at which holding of the substrate W is released.

The rotation mechanism 30 is a mechanism that rotates the substrate holding unit 20. The rotation mechanism 30 is accommodated in a motor cover 31 which is provided below the spin base 21. As indicated by a dotted line in FIG. 3, the rotation mechanism 30 includes a spin motor 32 and a support shaft 33. The support shaft 33 extends in the vertical direction, a bottom end portion thereof is connected to the spin motor 32, and a top end portion thereof is fixed to the center of the bottom surface of the spin base 21. When the spin motor 32 is activated, the support shaft 33 rotates about an axis 330 thereof. The substrate holding unit 20 and a substrate W held by the substrate holding unit 20 also rotate about the axis 330 along with the support shaft 33.

The fluid supply unit 40 is a mechanism that supplies a processing liquid and an inert gas to the top surface of a substrate W held by the substrate holding unit 20. As illustrated in FIGS. 2 and 3, the fluid supply unit 40 includes a first nozzle 41, a second nozzle 42, and a third nozzle 43.

The first nozzle 41 includes a first nozzle arm 411, a first nozzle head 412 that is provided at the tip of the first nozzle arm 411, and a first nozzle motor 413. The second nozzle 42 includes a second nozzle arm 421, a second nozzle head 422 that is provided at the tip of the second nozzle arm 421, and a second nozzle motor 423. The third nozzle 43 includes a third nozzle arm 431, a third nozzle head 432 that is provided at the tip of the third nozzle arm 431, and a third nozzle motor 433.

The nozzle arms 411, 421, and 431 rotate individually in the horizontal direction about base ends of the nozzle anus 411, 421, and 431 by activating the nozzle motors 413, 423, and 433 as indicated arrows in FIG. 2. Accordingly, the nozzle heads 412, 422, and 432 can be moved between a processing position above a substrate W held by the substrate holding unit 20 and a retracting position outside the processing liquid collecting unit 50.

Figure 4:
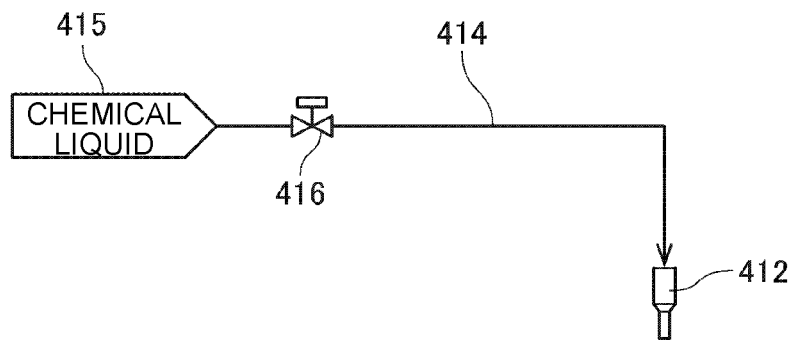
FIG. 4 is a diagram illustrating an example of a liquid supply unit which is connected to a first nozzle head.

FIG. 4 is a diagram illustrating an example of a liquid supply unit which is connected to the first nozzle head 412. In the example illustrated in FIG. 4, the first nozzle head 412 is connected to a chemical liquid source 415 via a chemical liquid pipe 414. A chemical liquid valve 416 is inserted in a path of the chemical liquid pipe 414. Accordingly, when the chemical liquid valve 416 is opened in a state in which the first nozzle head 412 is disposed at the processing position, a chemical liquid is supplied from the chemical liquid source 415 to the first nozzle head 412 via the chemical liquid pipe 414. The chemical liquid is discharged from the first nozzle head 412 to the top surface of the substrate W.

Examples of the chemical liquid discharged from the first nozzle head 412 include an SPM cleaning solution (a mixed solution of sulfuric acid and hydrogen peroxide water), an SC1 cleaning solution (a mixed solution of ammonia water, hydrogen peroxide water, and pure water), an SC2 cleaning solution (a mixed water of hydrochloric acid, hydrogen peroxide water, and pure water), and a DHF cleaning solution (dilute hydrofluoric acid).

Figure 5:
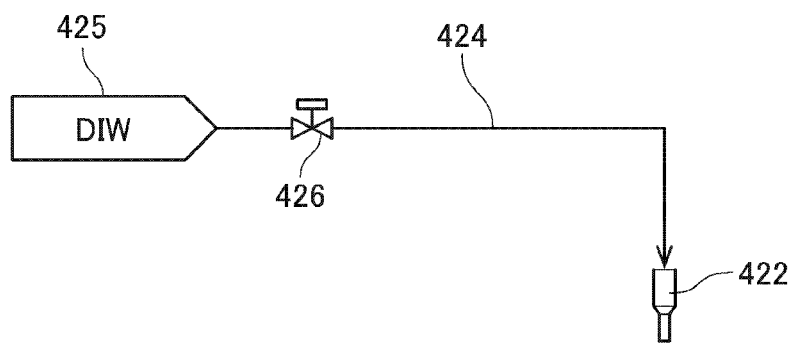
FIG. 5 is a diagram illustrating an example of a liquid supply unit which is connected to a second nozzle head.

FIG. 5 is a diagram illustrating an example of a liquid supply unit which is connected to the second nozzle head 422. In the example illustrated in FIG. 5, the second nozzle head 422 is connected to a pure water source 425 via a pure water pipe 424. A pure water valve 426 is inserted in a path of the pure water pipe 424. Accordingly, when the pure water valve 426 is opened in a state in which the second nozzle head 422 is disposed at the processing position, pure water (deionized water) is supplied from the pure water source 425 to the second nozzle head 422 via the pure water pipe 424. The pure water is discharged from the second nozzle head 422 to the top surface of the substrate W.

Figure 6:
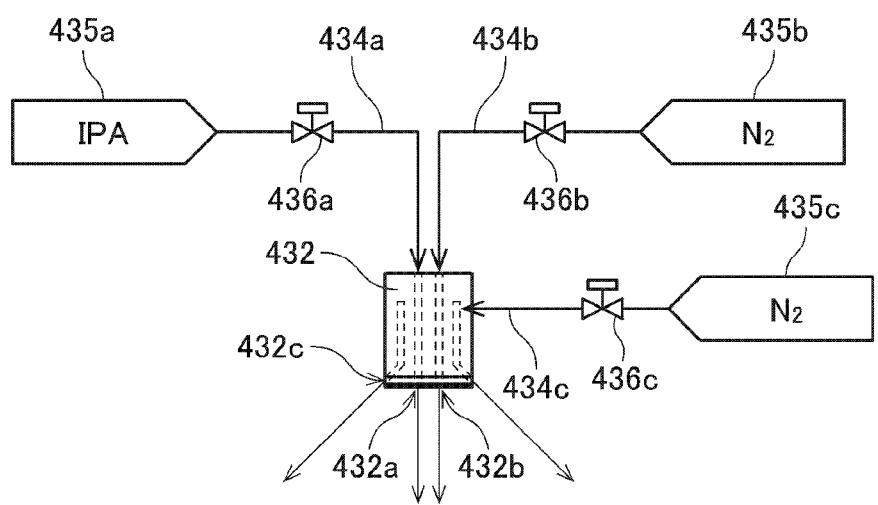
FIG. 6 is a diagram illustrating an example of a liquid supply unit and a gas supply unit which are connected to a third nozzle head.

FIG. 6 is a diagram illustrating an example of a liquid supply unit and a gas supply unit which are connected to the third nozzle head 432. In the example illustrated in FIG. 6, the third nozzle head 432 includes an IPA discharge port 432a, a vertical blowout port 432b, and an oblique blowout port 432c.

The IPA discharge port 432a is connected to an IPA source 435a via an IPA pipe 434a. An IPA valve 436a is inserted in a path of the IPA pipe 434a. Accordingly, when the IPA valve 436a is opened in a state in which the third nozzle head 432 is disposed at the processing position, isopropyl alcohol (IPA) which is an organic solvent is supplied from the IPA source 435a to the third nozzle head 432 via the IPA pipe 434a. The IPA is discharged from the IPA discharge port 432a of the third nozzle head 432 to the top surface of the substrate W.

The vertical blowout port 432b is connected to a first nitrogen gas source 435b via a first nitrogen gas pipe 434b. A vertical blowout valve 436b is inserted in a path of the first nitrogen gas pipe 434b. Accordingly, when the vertical blowout valve 436b is opened in a state in which the third nozzle head 432 is disposed at the processing position, nitrogen gas which is an inert gas is supplied from the first nitrogen gas source 435b to the third nozzle head 432 via the first nitrogen gas pipe 434b. The nitrogen gas is blown out downward from the vertical blowout port 432b of the third nozzle head 432 to the top surface of the substrate W.

The oblique blowout port 432c is connected to a second nitrogen gas source 435c via a second nitrogen gas pipe 434c. An oblique blowout valve 436c is inserted in a path of the second nitrogen gas pipe 434c. Accordingly, when the oblique blowout valve 436c is opened in a state in which the third nozzle head 432 is disposed at the processing position, nitrogen gas which is an inert gas is supplied from the second nitrogen gas source 435c to the third nozzle head 432 via the second nitrogen gas pipe 434c. The nitrogen gas is blown out outward and obliquely downward from the oblique blowout port 432c of the third nozzle head 432 to the top surface of the substrate W.

The nozzles 41 to 43 may selectively discharge a plurality of types of processing liquids. The number of nozzles provided in the processing unit 102 is not limited to three, and may be one, two, or equal to or greater than four.

The processing liquid collecting unit 50 is a part that collects used processing liquids. As illustrated in FIG. 3, the processing liquid collecting unit 50 includes an inner cup 51, a middle cup 52, and an outer cup 53. The inner cup 51, the middle cup 52, and the outer cup 53 can be independently moved up and down by a lifting mechanism which is not illustrated.

The inner cup 51 includes an annular first guide plate 510 that surrounds the substrate holding unit 20. The middle cup 52 includes an annular second guide plate 520 that is located outside and above the first guide plate 510. The outer cup 53 includes an annular third guide plate 530 that is located outside and above the second guide plate 520. The bottom of the inner cup 51 extends to the bottoms of the middle cup 52 and the outer cup 53. On the top surface of the bottom portions, a first discharged liquid groove 511, a second discharged liquid groove 512, and a third discharged liquid groove 513 are sequentially provided from the inner side.

A processing liquid supplied from the fluid supply unit 40 to the top surface of the substrate W flies outward due to a centrifugal force from rotation of the substrate W or blowout of nitrogen gas in a drying process which will be described later. The processing liquid flying from the substrate W is collected in one of the first guide plate 510, the second guide plate 520, and the third guide plate 530. The processing liquid collected in the first guide plate 510 is discharged to the outside of the processing unit 102 via the first discharged liquid groove 511. The processing liquid collected in the second guide plate 520 is discharged to the outside of the processing unit 102 via the second discharged liquid groove 512. The processing liquid collected in the third guide plate 530 is discharged to the outside of the processing unit 102 via the third discharged liquid groove 513.

In this way, the processing unit 102 includes a plurality of routes for discharging a processing liquid. Accordingly, each kind of processing liquid supplied to a substrate can be individually recovered. Accordingly, a process of disposing or recycling the recovered processing liquids can be separately performed depending on features of the processing liquids.

The heating unit 60 heats the substrate W in a drying process which will be described later. The heating unit 60 in this embodiment includes a disc-shaped hot plate 61 and a heater 62 serving as a heat source. The hot plate 61 is disposed between the top surface of the spin base 21 and the bottom surface of the substrate W held by the chuck pins 22. The heater 62 is embedded in the hot plate 61. For example, an electric heating wire such as a nichrome wire emitting heat with supply of power is used as the heater 62. When power is supplied to the heater 62, the hot plate 61 is heated to a temperature higher than an environmental temperature.

The processing unit 102 may further include a lifting mechanism that moves the hot plate 61 up and down. For example, the lifting mechanism can move the hot plate 61 up to a heating position close to the bottom surface of the substrate W at the time of heating and move the hot plate 61 down to a non-heating position lower than the heating position at the time of non-heating.

The imaging unit 70 is a device that images the top surface of the substrate W. The imaging unit 70 is installed, for example, at a position close to the inner surface of the side wall 12 of the chamber 10. As illustrated in FIGS. 2 and 3, the imaging unit 70 includes a light source 71 and a camera 72. For example, an LED is used as the light source 71. For example, a digital camera including an imaging element such as a charge coupled devices (CCD) or complementary metal oxide semiconductor (CMOS) is used as the camera 72. The imaging unit 70 acquires a captured image of the top surface of the substrate W by performing an imaging operation using the camera 72 while emitting light from the light source 71. The captured image is constituted by a plurality of pixels and includes information of a luminance value for each pixel.

Figure 7:
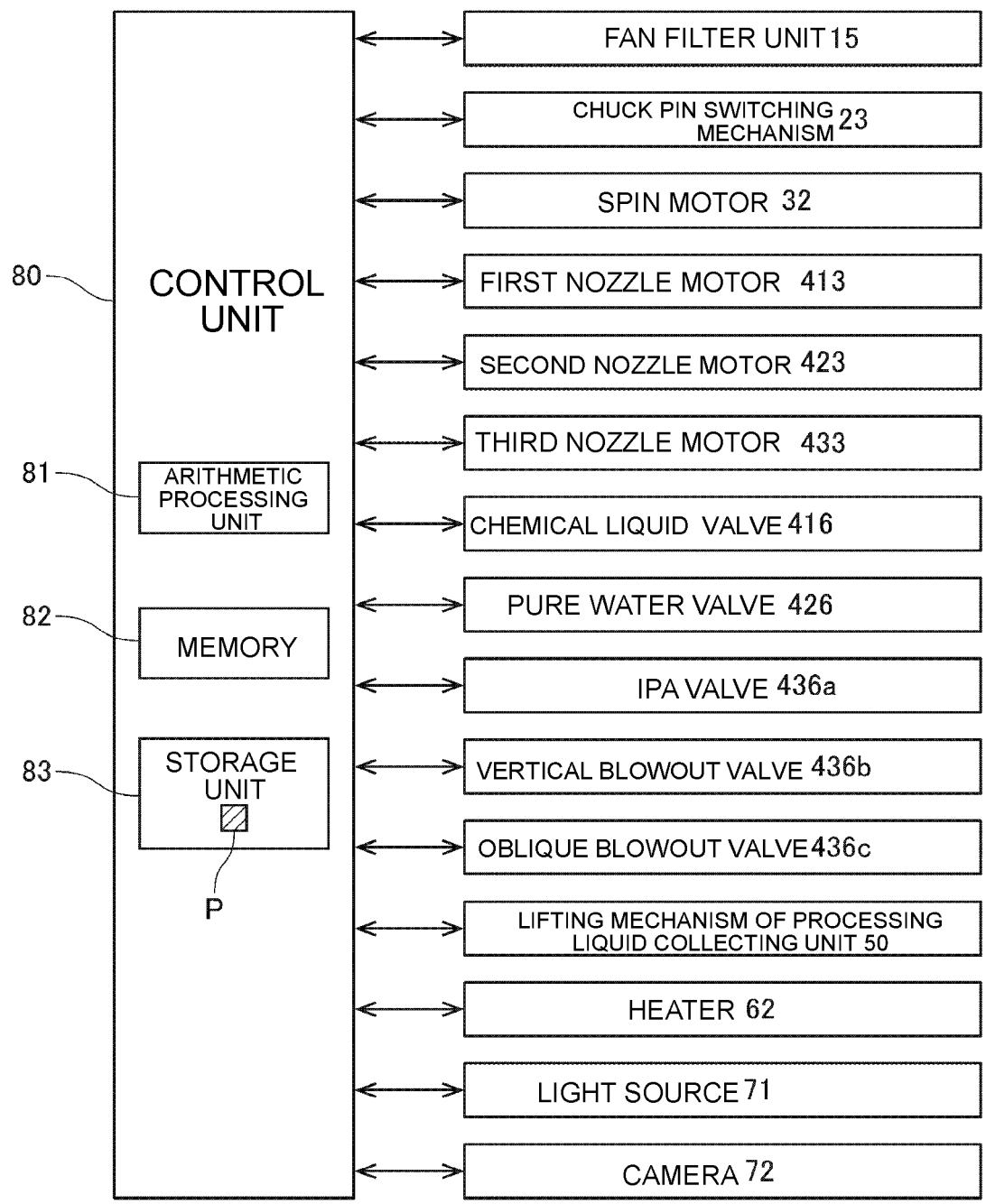
FIG. 7 is a block diagram illustrating connections between constituent elements in a control unit and a processing unit.

The control unit 80 is a means that controls operations of the constituent elements of the processing unit 102. FIG. 7 is a block diagram illustrating connections between constituent elements in the control unit 80 and the processing unit 102. As conceptually illustrated in FIG. 7, the control unit 80 is constituted by a computer including a processor 81 such as a CPU, a memory 82 such as a RAM, and a storage unit 83 such as a hard disk drive. A computer program P for executing processing of a substrate W in the processing unit 102 is installed in the storage unit 83.

As illustrated in FIG. 7, the control unit 80 is communicatively connected to the fan filter unit 15, the chuck pin switching mechanism 23, the spin motor 32, the first nozzle motor 413, the second nozzle motor 423, the third nozzle motor 433, the chemical liquid valve 416, the pure water valve 426, the IPA valve 436a, the vertical blowout valve 436b, the oblique blowout valve 436c, the lifting mechanism of the processing liquid collecting unit 50, the heater 62, the light source 71, and the camera 72. The control unit 80 controls operations of the constituent elements by temporarily reading the computer program P or data stored in the storage unit 83 into the memory 82 and causing the processor 81 to perform arithmetic operations based on the computer program P. Accordingly, processing of a substrate W in the processing unit 102 or a determination process which will be described later is performed.

3. Operation of Substrate Processing Equipment

Figure 8:
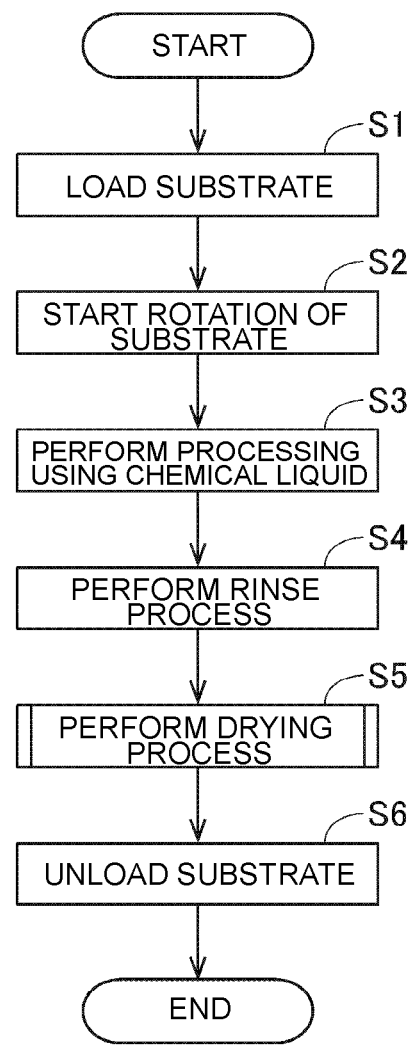
FIG. 8 is a flowchart illustrating a flow of substrate processing in the processing unit.

Processing of a substrate W in the processing unit 102 will be described below with reference to the flowchart illustrated in FIG. 8.

When the processing unit 102 processes a substrate W, first, the main delivery robot 103 loads a substrate W to be processed into the chamber 10 (Step 51). The substrate W loaded into the chamber 10 is held horizontally by a plurality of chuck pins 22 of the substrate holding unit 20. Thereafter, by driving the spin motor 32 of the rotation mechanism 30, rotation of the substrate W is started (Step S2). Specifically, the support shaft 33, the spin base 21, a plurality of chuck pins 22, and the substrate W held by the chuck pins 22 rotate about the axis 330 of the support shaft 33.

Subsequently, processing using a chemical liquid is performed on the top surface of the substrate W (Step S3). Specifically, first, the first nozzle head 412 is moved to the processing position facing the top surface of the substrate W by driving the first nozzle motor 413. Thereafter, the chemical liquid valve 416 is opened. Then, a chemical liquid is discharged from the first nozzle head 412 to the center of the top surface of the rotating substrate W. The discharged chemical liquid spreads on the whole top surface of the substrate W with the centrifugal force due to the rotation of the substrate W. Accordingly, chemical liquid processing such as etching and cleaning is performed on the top surface of the substrate W. When discharge of the chemical liquid for a predetermined time is completed, the chemical liquid valve 416 is closed to stop discharge of the chemical liquid from the first nozzle head 412. Thereafter, the first nozzle head 412 is moved from the processing position to the retracting position by driving the first nozzle motor 413.

Then, a rinse process using pure water is performed on the top surface of the substrate W (Step S4). Specifically, first, the second nozzle head 422 is moved to the processing position facing the top surface of the substrate W by driving the second nozzle motor 423. Then, the pure water valve 426 is opened. Then, pure water is discharged from the second nozzle head 422 to the center of the top surface of the rotating substrate W. The discharged pure water spreads on the whole top surface of the substrate W with the centrifugal force due to the rotation of the substrate W. Accordingly, the chemical liquid remaining on the surface of the substrate W is washed out. When discharge of the pure water for a predetermined time is completed, the pure water valve 426 is closed to stop discharge of the pure water from the second nozzle head 422. Thereafter, the second nozzle head 422 is moved from the processing position to the retracting position by driving the second nozzle motor 423.

Subsequently, a drying process of removing pure water from the top surface of the substrate W is performed (Step S5).

Figure 9:
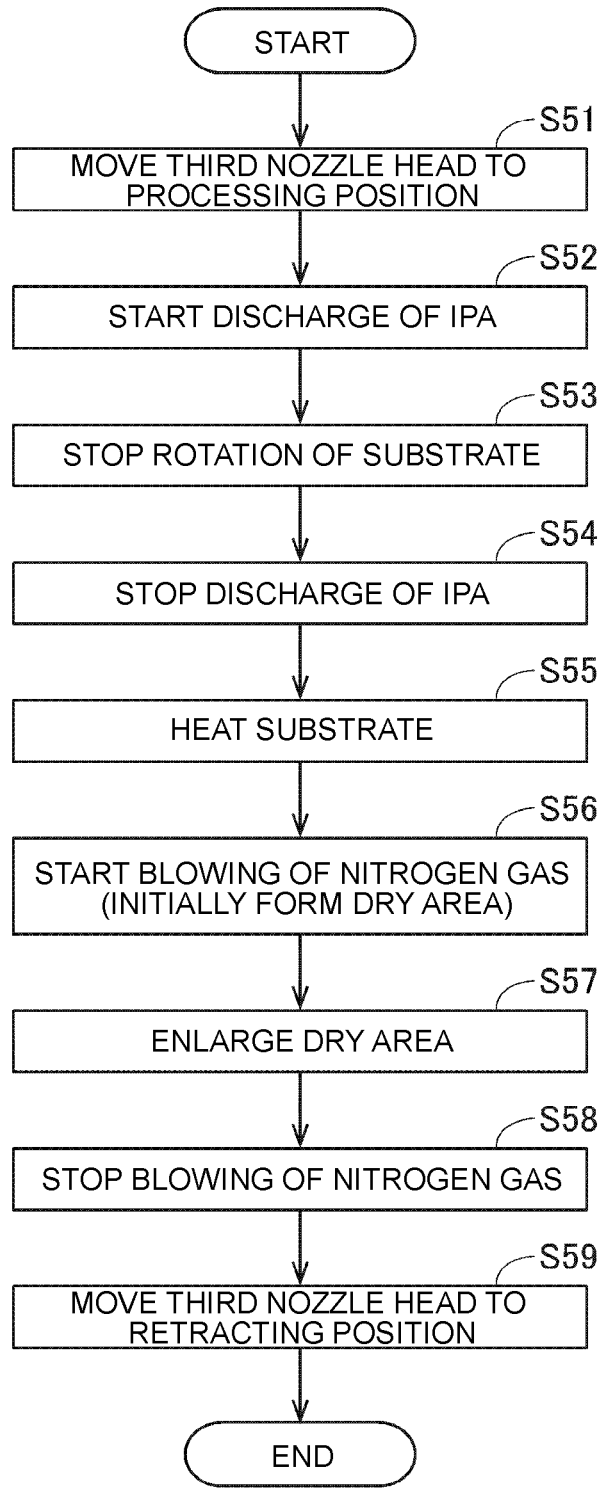
FIG. 9 is a flowchart illustrating a detailed flow of a drying process.

FIG. 9 is a flowchart illustrating a detailed flow of the drying process. As illustrated in FIG. 9, when the drying process is performed, first, the third nozzle head 432 is moved to the processing position facing the top surface of the substrate W by driving the third nozzle motor 433 (Step S51). Then, the IPA valve 436a is opened. Then, IPA is discharged from the IPA discharge port 432a of the third nozzle head 432 to the center of the top surface of the rotating substrate W (Step S52). The discharged IPA spreads on the whole top surface of the substrate W with the centrifugal force due to the rotation of the substrate W. IPA is a liquid having a smaller surface tension than pure water. Accordingly, when IPA is supplied to the top surface of the substrate W, pure water remaining on the top surface of the substrate W is replaced with the IPA.

Figure 10:
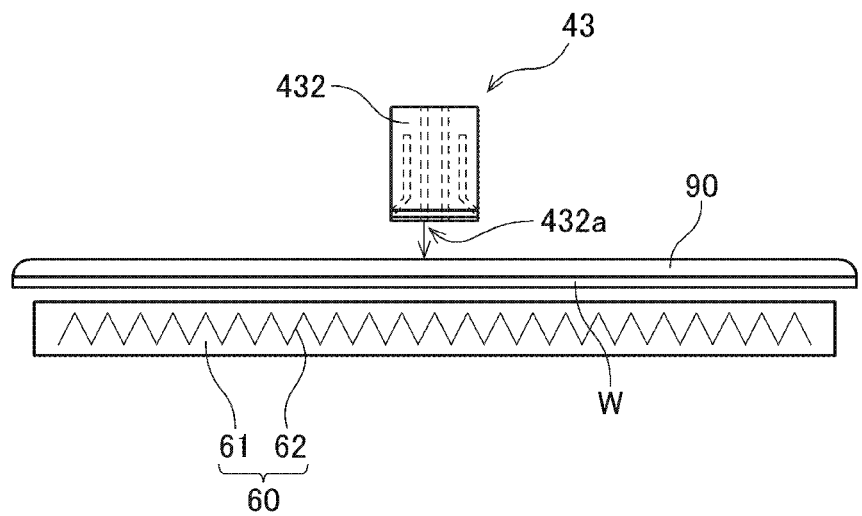
FIG. 10 is a diagram illustrating a state in which a liquid membrane is formed on a top surface of a substrate.

Thereafter, by stopping the spin motor 32 of the rotation mechanism 30, rotation of the substrate W is stopped (Step S53). By closing the IPA valve 436a, discharge of IPA from the third nozzle head 432 is stopped (Step S54). Then, as illustrated in FIG. 10, a liquid membrane 90 of IPA is formed in a paddle shape on the top surface of the substrate W. That is, in this embodiment, the IPA discharge port 432a of the third nozzle head 432 functions as a liquid membrane forming unit that forms the liquid membrane 90 of IPA on the top surface of the substrate W.

Figure 11:
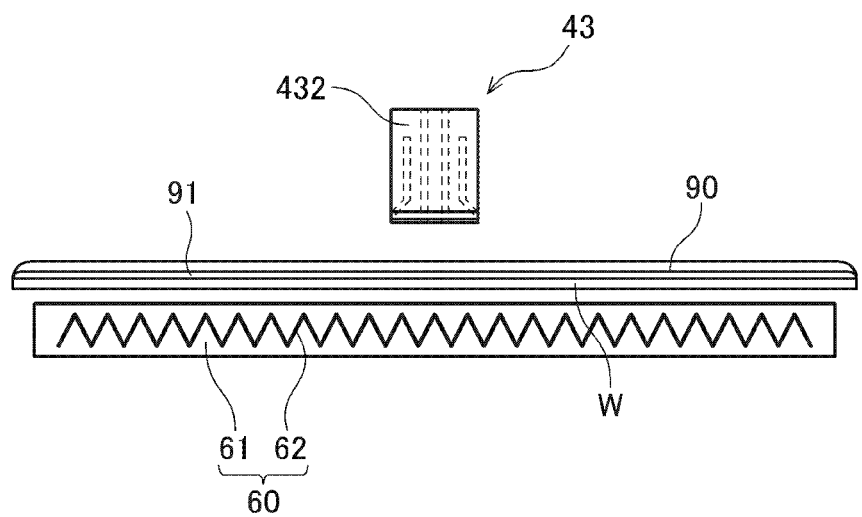
FIG. 11 is a diagram illustrating a state in which a vapor layer is formed between the top surface of the substrate and the liquid membrane.

Subsequently, power is supplied to the heater 62 of the heating unit 60. Accordingly, the temperature of the heating unit 60 is increased and the substrate W is heated with heat from the heating unit 60 (Step S55). Then, a lower layer of the liquid membrane 90 of IPA in contact with the top surface of the substrate W is also heated. The lower layer of the liquid membrane 90 is vaporized. As a result, as illustrated in FIG. 11, a vapor layer 91 of IPA is formed between the top surface of the substrate W and the liquid membrane 90.

Figure 12:
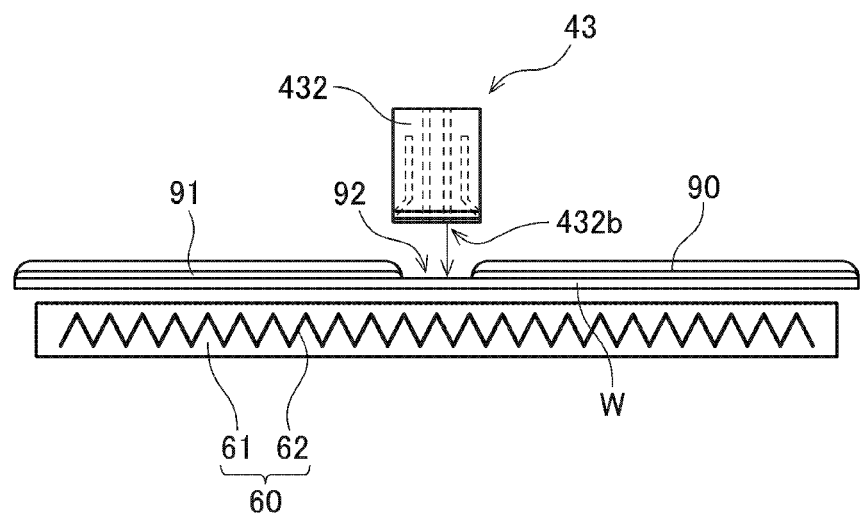
FIG. 12 is a diagram illustrating a state in which a dry area is initially formed at the center of the top surface of the substrate.

Subsequently, the vertical blowout valve 436b is opened. Then, nitrogen gas is blown from the vertical blowout port 432b of the third nozzle head 432 to the center of the top surface of the substrate W. Accordingly, as illustrated in FIG. 12, the central portion of the liquid membrane 90 is opened. That is, a dry area 92 from which IPA has been removed is initially formed at the center of the top surface of the substrate W (Step S56). That is, in this embodiment, the vertical blowout port 432b of the third nozzle head 432 and the gas supply unit connected to the vertical blowout port 432b function as a first drying unit that initially forms the dry area 92.

Figure 13:
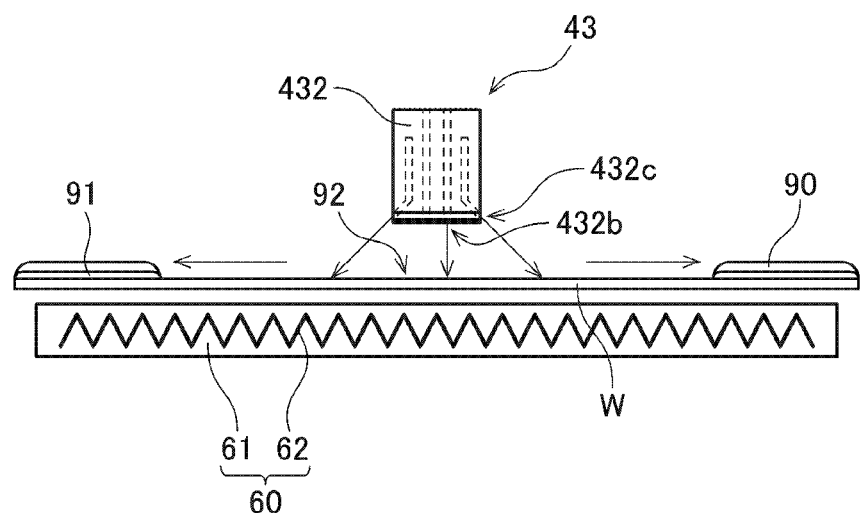
FIG. 13 is a diagram illustrating a state in which the dry area is gradually enlarged.

Subsequently, the oblique blowout valve 436c is opened. Then, nitrogen gas is blown from the oblique blowout port 432c of the third nozzle head 432 to the top surface of the substrate W outward and obliquely downward. Accordingly, the dry area 92 which has been initially formed in step S56 is gradually enlarged as illustrated in FIG. 13 (Step S57). As a result, IPA is removed from the top surface of the substrate W and the substrate W is dried. That is, in this embodiment, the oblique blowout port 432c of the third nozzle head 432 and the gas supply unit connected to the oblique blowout port 432c function as a second drying unit that enlarges the dry area 92.

When IPA is removed from the top surface of the substrate W, the vertical blowout valve 436b and the oblique blowout valve 436c are closed. Accordingly, blowout of nitrogen gas from the third nozzle head 432 is stopped (Step S58). Thereafter, the third nozzle head 432 is moved from the processing position to the retracting position by driving the third nozzle motor 433 (Step S59).

In this way, the processing unit 102 in this embodiment removes the liquid membrane 90 by forming the vapor layer 91 of IPA between the top surface of the substrate W and the liquid membrane 90 and gradually enlarging the dry area 92 from the center of the top surface of the substrate W. Accordingly, at the time of removal of the liquid membrane 90, a stress is not easily applied to patterns formed on the top surface of the substrate W. Accordingly, it is possible to prevent collapse of patterns due to the drying process.

Description will be made below referring back to the flowchart of FIG. 8. When the drying process of the substrate W ends, holding of the substrate W by the plurality of chuck pins 22 is released. The main delivery robot 103 takes out the processed substrate W from the substrate holding unit 20 and unloads the substrate W to the outside of the chamber 10 (Step S6).

4. Determination of Quality of Drying Process

In the drying process of Step S5, formation and enlargement of the dry area 92 is not easily performed stably as intended. That is, when a plurality of substrates W are sequentially processed, the positions, the shapes, or the numbers of the dry areas 92 may not be achieved as intended at the time of performing the drying process on some substrates W.

For example, in Step S55, a substrate W is heated to form the vapor layer 91 of IPA between the top surface of the substrate W and the liquid membrane 90. At this time, fine bubbles may be formed in the liquid membrane 90 and thus an opening may be formed in a part of the liquid membrane 90. When an opening is formed in a part of the liquid membrane 90 before nitrogen gas is blown in Step S56, vapor of IPA between the top surface of the substrate W and the liquid membrane 90 leaks from the opening. Then, the vapor layer 91 cannot be maintained.

In Step S57, the dry area 92 is gradually enlarged by blowout of nitrogen gas. At this time, the shape of the dry area 92 may collapse or a plurality of dry areas 92 may be formed.

Therefore, the processing unit 102 in this embodiment monitors captured images of the top surface of the substrate W and performs a process of determining whether the dry area 92 is in a normal state in parallel with the drying process of Step S5. The determination process will be described below.

<4-1. Determination Process of Step S55>

First, the determination process of Step S55 will be described. In Step S55, it is determined whether an opening has been formed in the liquid membrane 90 before initial formation of the dry area 92 (Step S56). Two methods including a first method and a second method will be described below as a method of the determination process.

<4-1-1. Determination Process (First Method) of Step S55>

Figure 14:
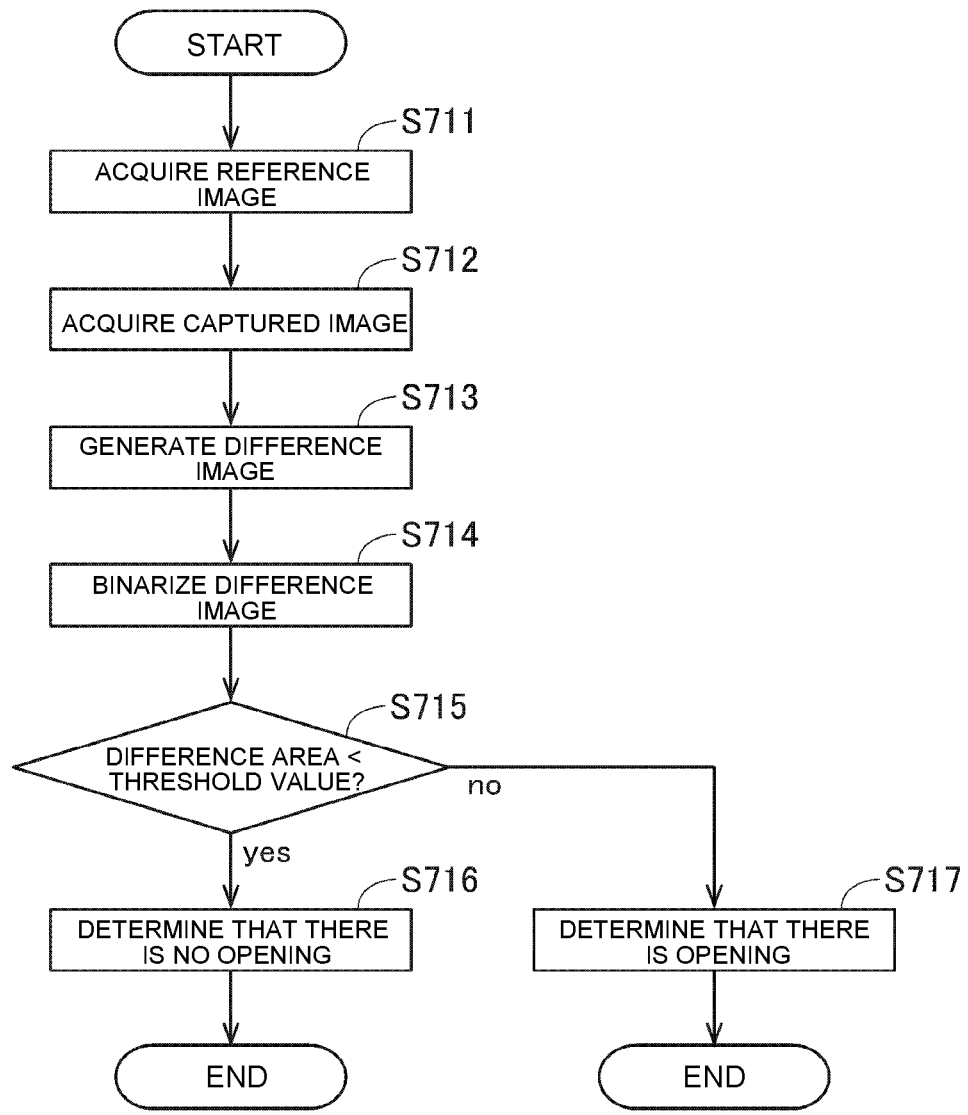
FIG. 14 is a flowchart illustrating a flow of a first method in a determination process of Step S55.

FIG. 14 is a flowchart illustrating a flow of a first method in the determination process of Step S55.

Figure 15:
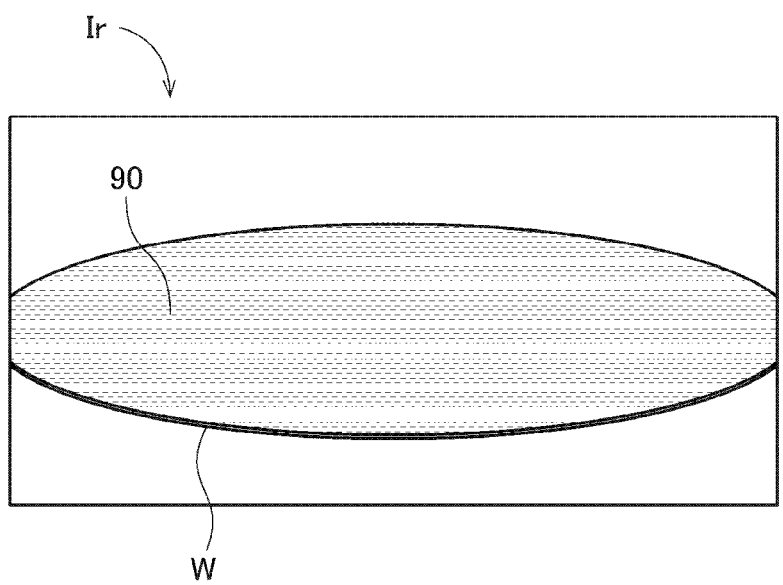
FIG. 15 is a diagram illustrating an example of a reference image.

In the example illustrated in FIG. 14, first, a reference image Ir is acquired (Step S711). Specifically, after a liquid membrane 90 of IPA is formed on the top surface of the substrate W in Step S54, the imaging unit 70 captures an image of the top surface of the substrate W. By this image capturing, the image of the top surface of the substrate W immediately after the liquid membrane 90 has been formed is acquired as a reference image Ir. FIG. 15 is a diagram illustrating an example of the reference image Ir acquired in Step S711. The acquired reference image Ir is input from the imaging unit 70 to the control unit 80 and is stored in the storage unit 83 of the control unit 80.

Figure 16:
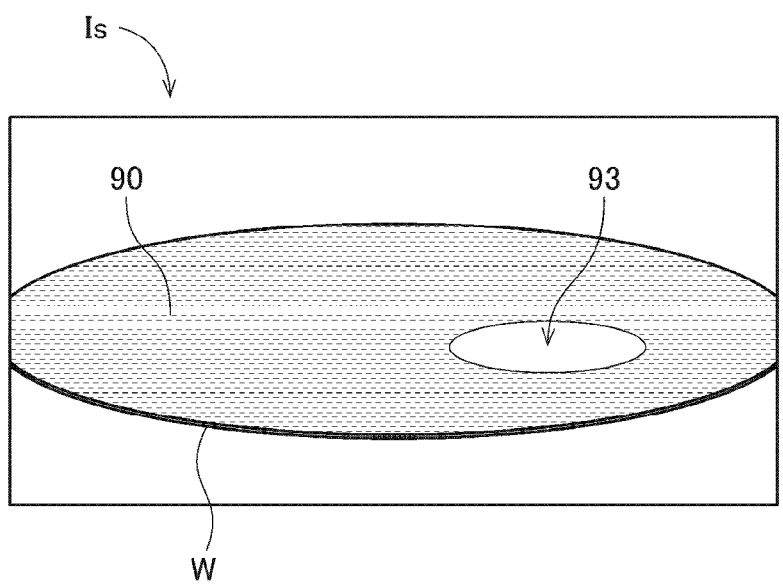
FIG. 16 is a diagram illustrating an example of a captured image.

When heating of the substrate W in Step S55 is started, the imaging unit 70 repeatedly captures an image of the top surface of the substrate W at predetermined time intervals (for example, 0.1 seconds). Accordingly, a captured image Is of the top surface of the substrate W after heating has been started is repeatedly acquired (Step S712). FIG. 16 is a diagram illustrating an example of the captured image Is acquired in Step S712. The acquired captured image Is is input from the imaging unit 70 to the control unit 80 and is stored in the storage unit 83 of the control unit 80.

Subsequently, the control unit 80 generates a difference image Id between the reference image Ir and the acquired captured image Is (Step S713). Specifically, a difference value between a luminance value of a pixel included in the reference image Ir and a luminance value of the corresponding pixel included in the captured image Is is calculated for each pixel and an image constituted by the calculated difference values is set as a difference image Id.

Figure 17:
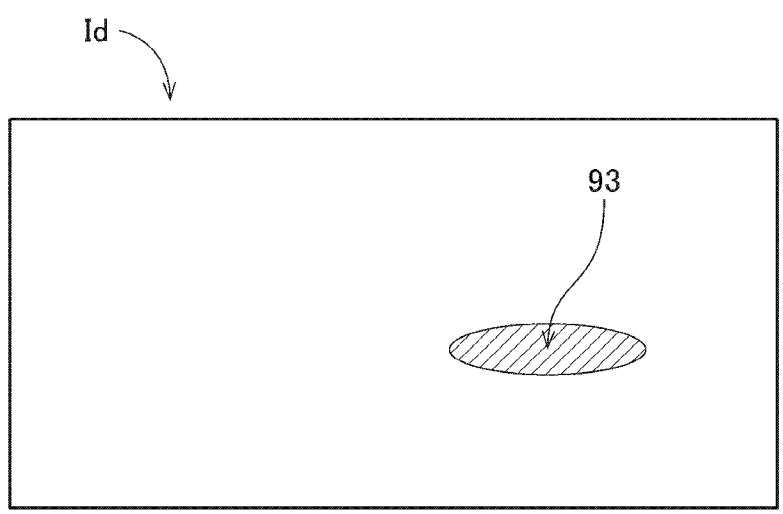
FIG. 17 is a diagram illustrating an example of a difference image.

FIG. 17 is a diagram illustrating an example of a difference image Id which is generated based on the reference image Ir illustrated in FIG. 15 and the captured image Is illustrated in FIG. 16. In the difference image Id, the luminance value of a pixel having no change between the reference image Ir and the captured image Is is almost zero and only a pixel having a change has a nonzero luminance value. Accordingly, when an opening 93 is formed in the liquid membrane 90, the luminance values of the part in the difference image Id are numerical values other than zero.

The control unit 80 sequentially generates such a difference image Id for a plurality of captured images Is which are repeatedly acquired by the imaging unit 70.

Thereafter, the control unit 80 binarizes the difference images Id which are sequentially acquired (Step S714). Specifically, the control unit 80 binarizes the luminance values of the pixels of a difference image Id into zero or a predetermined value using a preset reference value as a threshold value. Then, the control unit 80 calculates an area of a part in which the luminance value is the above-mentioned predetermined value (hereinafter referred to as a "difference area") in the binarized difference image Id. The control unit 80 compares the calculated difference area with a preset threshold value (Step S715). When the difference area is less than the threshold value, the control unit 80 determines that an opening 93 is not formed in the liquid membrane 90 (Step S716). On the other hand, when the difference area is equal to or greater than the threshold value, the control unit 80 determines that an opening 93 is formed in the liquid membrane 90 (Step S717).

When it is determined in Step S717 that an opening 93 is formed in the liquid membrane 90, the control unit 80 issues an alarm to notify a user of abnormality. The alarm may be, for example, emission of light from a warning lamp, emission of voice or warning sound, or display of a message on a screen.

<4-1-2. Determination Process (Second Method) of Step S55>

Figure 18:
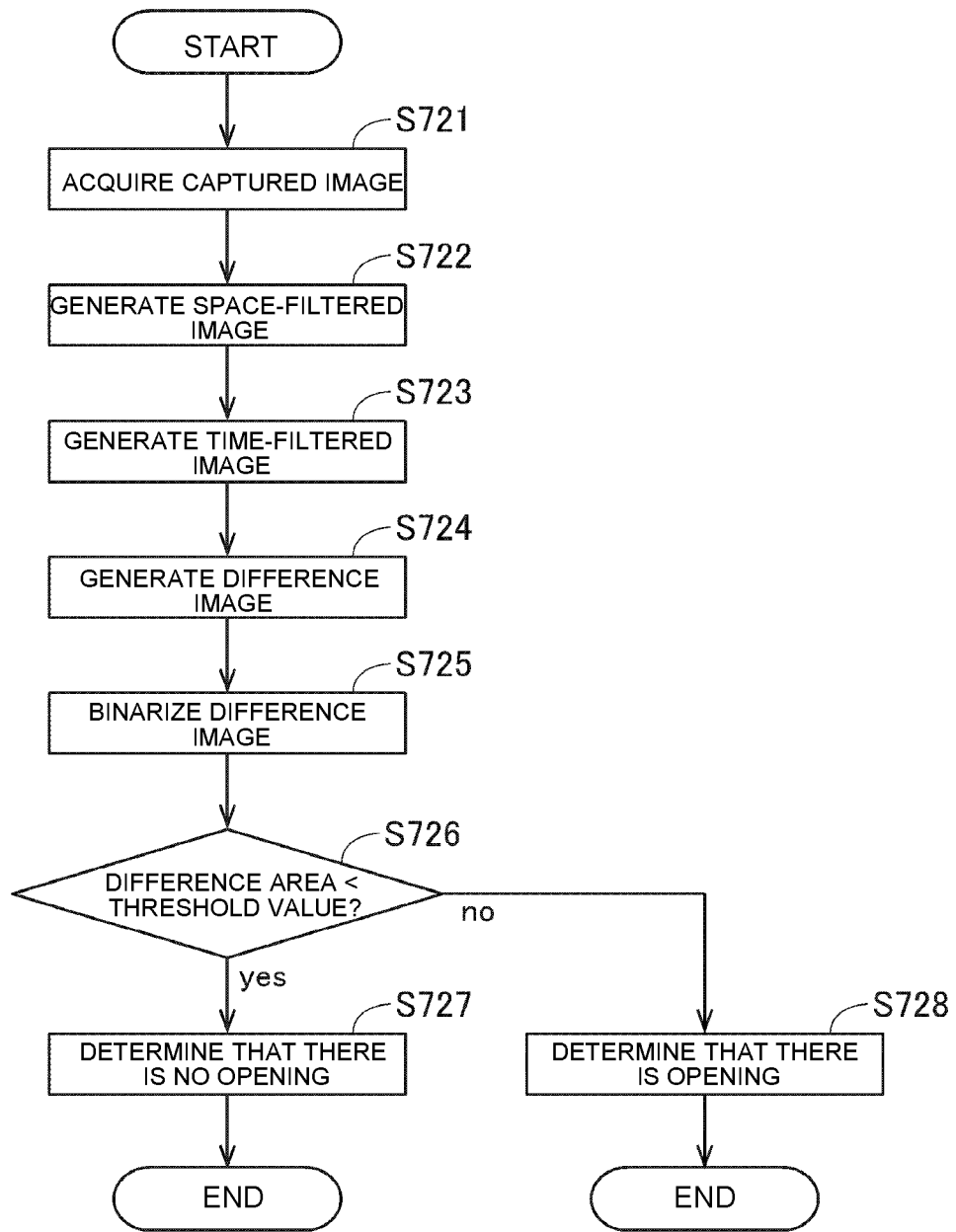
FIG. 18 is a flowchart illustrating a flow of a second method in the determination process of Step S55.

FIG. 18 is a flowchart illustrating a flow of a second method in the determination process of Step S55.

In the example illustrated in FIG. 18, when heating of the substrate W in Step S55 is started, the imaging unit 70 repeatedly captures an image of the top surface of the substrate W at predetermined time intervals (for example, 0.1 seconds). Accordingly, a captured image Is of the top surface of the substrate W after heating has been started is repeatedly acquired (Step S721). The acquired captured image Is is input from the imaging unit 70 to the control unit 80 and is stored in the storage unit 83 of the control unit 80.

Then, the control unit 80 performs a filtering process in a space direction on each of a plurality of acquired captured images Is. Accordingly, a plurality of space-filtered images are generated (Step S722). For example, a known averaging filtering process or a known Gaussian filtering process is used as the filtering process in the space direction. The averaging filtering process is a process of replacing a luminance value of each pixel included in an image with an average value of luminance values of pixels in a predetermined range including the pixel. The Gaussian filtering process is a process of replacing a luminance value of each pixel included in an image with a value in which luminance values of neighboring pixels are reflected at a ratio based on the Gaussian distribution.

The control unit 80 performs a filtering process in a time direction on each of the plurality of acquired captured images Is. Accordingly, a plurality of time-filtered images are generated (Step S723). Specifically, a luminance value of each pixel in each captured image Is is replaced with a value in which luminance values at the same coordinates as in captured images Is acquired before and after are reflected. For example, a luminance value of each pixel in a captured image Is is replaced with an average value of luminance values at the same coordinates as in a plurality of captured images including the corresponding captured image Is. Alternatively, a luminance value of each pixel in a captured image Is is replaced with a value in which luminance values in captured images Is acquired before and after are reflected at a ratio based on the Gaussian distribution. The number of captured images Is before and after to be reflected may be one or two or more.

The space-filtered image and the time-filtered image which have been subjected to the filtering processes become more smooth than the captured image Is before being subjected to the filtering processes. Accordingly, fine noise included in the captured image Is is removed. When an opening 93 is formed in the liquid membrane 90, a large difference in luminance value between the space-filtered image and the time-filtered image is generated in the corresponding part.

Subsequently, the control unit 80 generates a difference image between the space-filtered image and the time-filtered image (Step S724). Specifically, a difference value between a luminance value of a pixel included in the space-filtered image and a luminance value of the corresponding pixel included in the time-filtered image is calculated for each pixel and an image constituted by the calculated difference values is set as a difference image.

The control unit 80 sequentially generates such a difference image for a plurality of captured images which are repeatedly acquired by the imaging unit 70.

Thereafter, the control unit 80 binarizes the difference images which are sequentially acquired (Step S725). Specifically, the control unit 80 binarizes the luminance values of the pixels of a difference image into zero or a predetermined value using a preset reference value as a threshold value. Then, the control unit 80 calculates an area of a part in which the luminance value is the above-mentioned predetermined value (hereinafter referred to as a "difference area") in the binarized difference image. The control unit 80 compares the calculated difference area with a preset threshold value (Step S726). When the difference area is less than the threshold value, the control unit 80 determines that an opening 93 is not formed in the liquid membrane 90 (Step S727). On the other hand, when the difference area is equal to or greater than the threshold value, the control unit 80 determines that an opening 93 is formed in the liquid membrane 90 (Step S728).

In the second method, it is determined whether there is an opening 93 based on the same type of difference images as a filtered image. Accordingly, it is less affected by local or temporary noise of an image than in the first method. Accordingly, it is possible to more stably determine whether an opening 93 is formed in the liquid membrane 90.

When it is determined in Step 5728 that an opening 93 is formed in the liquid membrane 90, the control unit 80 issues an alarm to notify a user of abnormality. The alarm may be, for example, emission of light from a warning lamp, emission of voice or warning sound, or display of a message on a screen.

<4-2. Determination Process of Step S57>

The determination process of Step S57 will be described below. In Step S57, the dry area 92 is gradually enlarged by blowout of nitrogen gas, and it is determined whether the shape of the dry area 92 at that time is a predetermined shape. Two methods including a first method and a second method will be described below as a method of the determination process.

<4-2-1. Determination Process (First Method) of Step S57>

Figure 19:
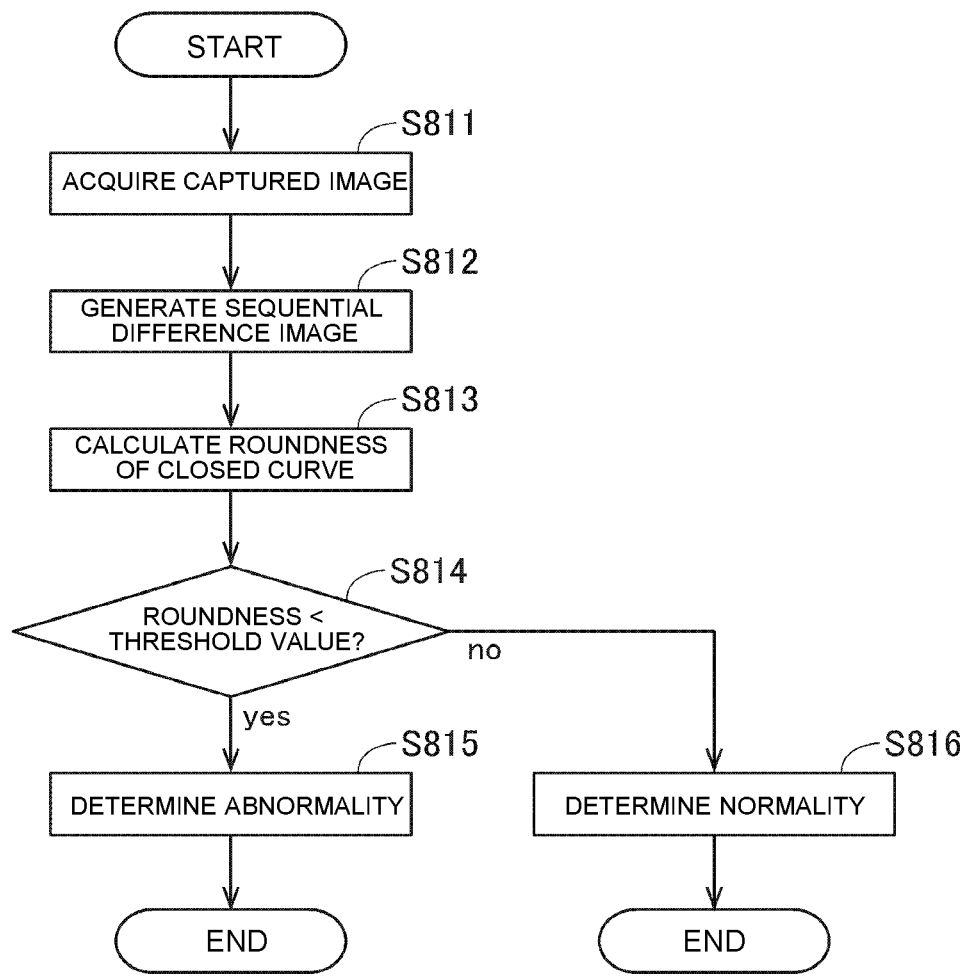
FIG. 19 is a flowchart illustrating a flow of the first method in the determination process of Step S57.

FIG. 19 is a flowchart illustrating a flow of a first method in the determination process of Step S57.

In the example illustrated in FIG. 19, when blowout of nitrogen gas in Step S57 is started, the imaging unit 70 repeatedly captures an image of the top surface of the substrate W at predetermined time intervals (for example, 0.1 seconds). Accordingly, a captured image Is of the top surface of the substrate W after blowout of nitrogen gas has been started is repeatedly acquired (Step S811). The acquired captured image Is is input from the imaging unit 70 to the control unit 80 and is stored in the storage unit 83 of the control unit 80.

Figure 20:
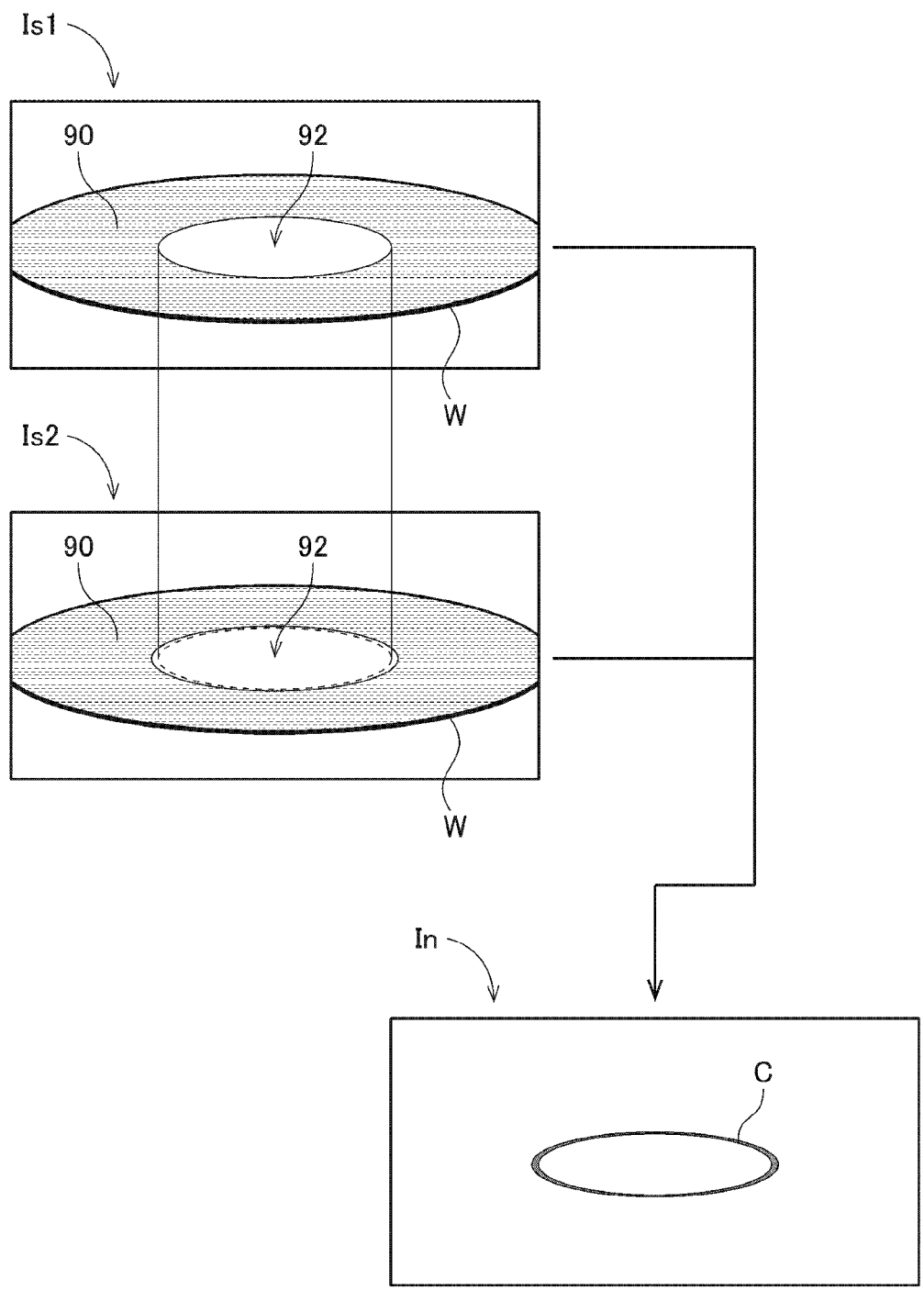
FIG. 20 is a diagram conceptually illustrating a state in which a sequential difference image is generated.

Then, the control unit 80 generates sequential difference images In of a plurality of acquired captured images Is (Step S812). FIG. 20 is a diagram conceptually illustrating a state in which a sequential difference image In is generated. Two captured images Is1 and Is2 in FIG. 20 are images which are continuously captured by the imaging unit 70. In Step 5812, one sequential difference image In is generated from such two captured images Is1 and Is2. Specifically, a difference value between a luminance value of a pixel included in the captured image Is1 and a luminance value of the corresponding pixel included in the captured image Is2 is calculated for each pixel. An image constituted by the calculated difference values is set as a sequential difference image In.

In the sequential difference image In, the luminance value of a pixel having no change between the two captured images Is1 and Is2 is almost zero and only a pixel having a change has a nonzero luminance value. Accordingly, when a dry area 92 is normally enlarged by blowout of nitrogen gas, a closed curve C corresponding to an edge of the dry area 92 appears in the sequential difference image In as illustrated in FIG. 20.

The control unit 80 sequentially generates such a sequential difference image In for a plurality of captured images Is which are repeatedly acquired by the imaging unit 70.

Subsequently, the control unit 80 calculates roundness R of the closed curve C appearing in the generated sequential difference image In (Step S813). Roundness R is calculated, for example, based on a length L of the closed curve C and an area S in the closed curve C. Specifically, the length L and the area S are instituted into Equation (1) which is a known equation representing roundness R.

$$R = 4\pi S / L^2 \qquad (1)$$

Subsequently, the control unit 80 compares the calculated roundness R with a preset threshold value (Step S814). When the roundness R is less than the threshold value, the control unit 80 determines that the shape of the dry area 92 is abnormal (Step S815). On the other hand, when the roundness R is equal to or greater than the threshold value, the control unit 80 determines that the shape of the dry area 92 is normal (Step S816).

The roundness R which is calculated by Equation (1) represents how a shape to be evaluated is close to a perfect circle. That is, the roundness R which is calculated Equation (1) is one when a shape to be evaluated is a perfect circle, and becomes smaller as the shape is more deformed from a perfect circle. Here, when the imaging unit 70 obliquely captures an image of the top surface of the substrate W as in this embodiment, a closed curve C appearing in a sequential difference image In at the time of normality is not a perfect circle but an ellipse. Accordingly, at the time of normality, the roundness R has a value less than one. When the shape of the dry area 92 is deformed, the closed curve C appearing in the sequential difference image In has a shape with roundness R lower than that of the ellipse. Accordingly, even when an imaging direction is inclined, it is possible to determine whether the dry area 92 is in a normal state using Equation (1).

When it is determined in Step 5815 that the shape of the dry area 92 is abnormal, the control unit 80 issues an alarm to notify a user of abnormality. The alarm may be, for example, emission of light from a warning lamp, emission of voice or warning sound, or display of a message on a screen.

<4-2-2. Determination Process (Second Method) of Step S57>

Figure 21:
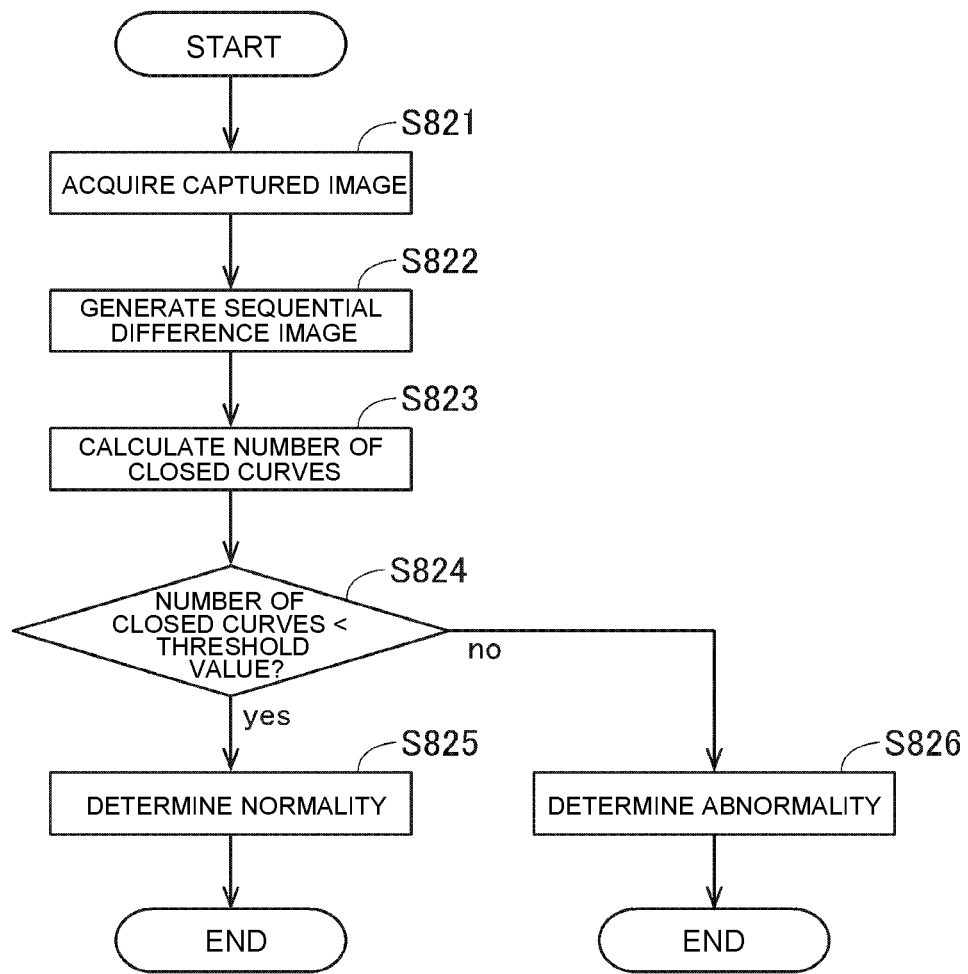
FIG. 21 is a flowchart illustrating a flow of the second method in the determination process of Step S57.

FIG. 21 is a flowchart illustrating a flow of a second method in the determination process of Step S57.

In the example illustrated in FIG. 21, when blowout of nitrogen gas in Step S57 is started, the imaging unit 70 repeatedly captures an image of the top surface of the substrate W at predetermined time intervals (for example, 0.1 seconds). Accordingly, a captured image Is of the top surface of the substrate W after blowout of nitrogen gas has been started is repeatedly acquired (Step S821). The acquired captured image Is is input from the imaging unit 70 to the control unit 80 and is stored in the storage unit 83 of the control unit 80.

Then, the control unit 80 sequentially generates sequential difference images In of a plurality of acquired captured images Is (Step S822). Generation of the sequential difference image In can be performed in the same way as in Step 5812 in the first method. When the dry area 92 is normally enlarged, one closed curve C appears in the sequential difference image In as illustrated in FIG. 20.

Subsequently, the control unit 80 counts the number of closed curves C appearing in the generated sequential difference image In (Step S823). Then, the control unit 80 compares the counted number of closed curves C with a preset threshold value (Step S824). The threshold value may be, for example, set to two. When the number of closed curves C is less than the threshold value, the control unit 80 determines that the number of dry areas 92 is normal (Step S825). On the other hand, when the number of closed curves C is equal to or greater than the threshold value, the control unit 80 determines that the number of dry areas 92 is abnormal (Step S826).

When it is determined in Step 5826 that the number of dry areas 92 is abnormal, the control unit 80 issues an alarm to notify a user of abnormality. The alarm may be, for example, emission of light from a warning lamp, emission of voice or warning sound, or display of a message on a screen.

<4-3. Conclusion>

As described above, in the processing unit 102, the top surface of a substrate W is repeatedly imaged during execution of the drying process of Step S5. Then, based on a plurality of acquired captured images Is, it is possible to quantitatively determine whether states of initial formation and enlargement of the dry area 92 are normal. Accordingly, a user can appropriately ascertain whether substrates W which are sequentially processed are normally dried based on the determination result and can take necessary countermeasures at the time of abnormality.

5. Modified Example

While an embodiment of the disclosure has been described above, the disclosure is not limited to the embodiment.

In the embodiment, initial formation of a dry area 92 is performed by blowing nitrogen gas to a substrate W. However, the initial formation of a dry area 92 may be performed by heating the vicinity of the center of the substrate W. By the heating, the vicinity of the center of a liquid membrane 90 can be vaporized to initially form a dry area 92.

In the embodiment, enlargement of a dry area 92 is performed by blowing nitrogen gas to a substrate W. However, the enlargement of a dry area 92 may be performed by gradually enlarging a heated area of the substrate W. By enlargement of the heated area, a liquid membrane 90 can be sequentially vaporized outward from the vicinity of the center to enlarge the dry area 92.

The disclosure can be applied to a case in which a vapor layer 91 is not formed between a top surface of a substrate W and a liquid membrane 90.

Figure 22:
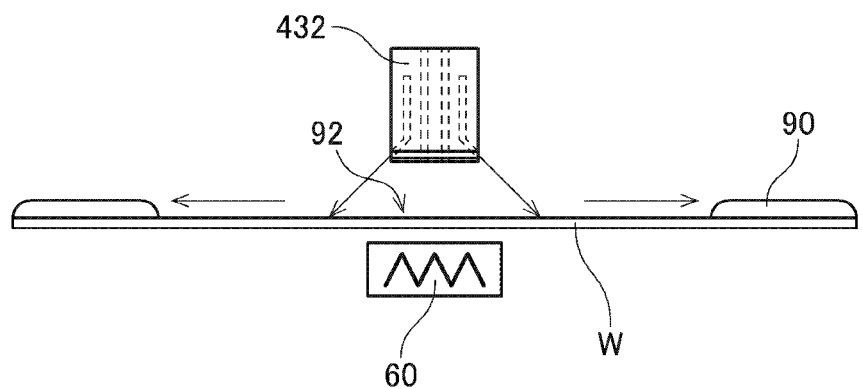
FIG. 22 is a diagram illustrating a modified example of the drying process.

FIG. 22 is a diagram illustrating a modified example of the drying process to which the disclosure can be applied. In the example illustrated in FIG. 22, the heating unit 60 is disposed below only the vicinity of the center of the substrate W. When the drying process is performed, first, the vicinity of the center of the substrate W is heated by the heating unit 60. Accordingly, the vicinity of the center of the liquid membrane 90 formed on the top surface of the substrate W is vaporized to initially form a dry area 92 at the center of the top surface of the substrate W. Thereafter, the dry area 92 is enlarged by blowing nitrogen gas from the third nozzle head 432.

Figure 23:
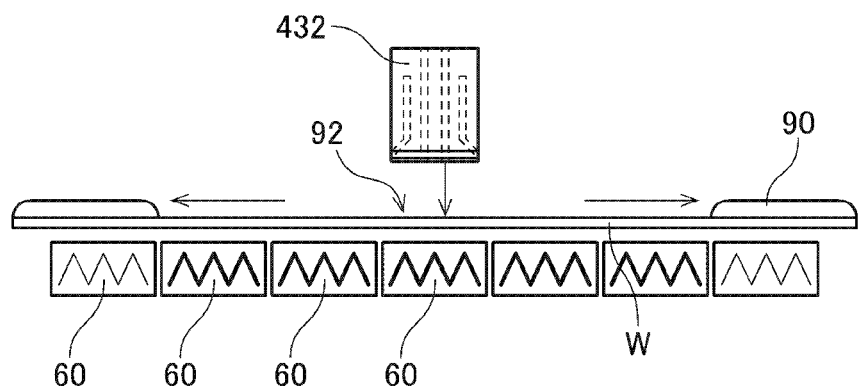
FIG. 23 is a diagram illustrating a modified example of the drying process.

FIG. 23 is a diagram illustrating another modified example of the drying process to which the disclosure can be applied. In the example illustrated in FIG. 23, a plurality of annular heating units 60 having different diameters are concentrically disposed below the substrate W. When the drying process is performed, first, a dry area 92 is initially formed at the center of the top surface of the substrate W by blowing nitrogen gas from the third nozzle head 432. Thereafter, the heating units 60 are sequentially turned on from the central heating unit 60 to the outermost heating unit 60. Accordingly, the heated area of the substrate W is gradually enlarged. As a result, the dry area 92 is enlarged.

Figure 24:
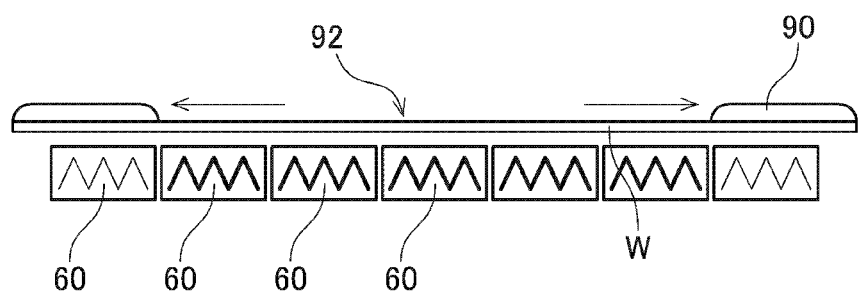
FIG. 24 is a diagram illustrating a modified example of the drying process.

FIG. 24 is a diagram illustrating another modified example of the drying process to which the disclosure can be applied. In the example illustrated in FIG. 24, a plurality of annular heating units 60 having different diameters are concentrically disposed below the substrate W. When the drying process is performed, first, the vicinity of the center of the substrate W is heated by the central heating unit 60. Accordingly, the vicinity of the center of the liquid membrane 90 formed on the top surface of the substrate W is vaporized to initially form a dry area 92 at the center of the top surface of the substrate W. Thereafter, the heating units 60 are sequentially turned on from the central heating unit 60 to the outermost heating unit 60. Accordingly, the heated area of the substrate W is gradually enlarged. As a result, the dry area 92 is enlarged.

In the above-mentioned embodiment, the dry area 92 is initially formed at the center of the top surface of the substrate W. However, the position at which the dry area 92 is initially formed may be a position which is away from the center of the top surface of the substrate W.

In the above-mentioned embodiment, IPA is used as a liquid for forming the liquid membrane 90. However, the liquid for forming the liquid membrane 90 may be an organic solvent other than IPA. The liquid for forming the liquid membrane 90 may be a processing liquid (for example, pure water) other than an organic solvent.

In the above-mentioned embodiment, nitrogen gas is used as gas which is blown onto the substrate W. However, the gas which is blown onto the substrate W may be inert gas (for example, argon gas) other than nitrogen gas.

In the above-mentioned embodiment, the control unit 80 has both a function of controlling operations of the constituent elements of the processing unit 102 and a function as a determination unit that determines the state of the dry area 92. However, the control unit that controls operations of the constituent elements of the processing unit 102 and the determination unit that determines the state of the dry area 92 may be embodied by different computers.

In the above-mentioned embodiment, the substrate W to be processed is a silicon wafer for semiconductor. However, the substrate to be processed in the disclosure is not limited to a silicon wafer, and may be another substrate for a precise electronic device such as a glass substrate for a flat panel display such as a liquid crystal display, a glass substrate for a photo mask, or a glass substrate for a solar cell.

A detailed shape of the substrate processing equipment may be different from the shapes illustrated in the drawings of the disclosure. The elements described in the above-mentioned embodiment or the above-mentioned modified examples may be appropriately combined without causing inconsistency.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A determination method of determining quality of a drying process in equipment that executes the drying process of forming a liquid membrane on a top surface of a substrate which is held horizontally and gradually enlarging a dry area from which the liquid membrane has been removed, the determination method comprising:
   a step of a) a camera that repeatedly images the top surface of the substrate during execution of the drying process; and
   a step of b) determining whether the dry area is in a normal state based on a plurality of captured images acquired in the step of a),
   wherein the step of b) comprises a step of c) determining Whether an opening is formed in the liquid membrane before the dry area is initially formed,
   wherein the step of c) comprises:
   c-11) generating a difference image between a reference image which is an image of the substrate immediately after the liquid membrane has been formed and the captured image;
   c-12) determining that the opening is formed when a difference area in the difference image is equal to or greater than a predetermined threshold value;
   c-21) performing a filtering process in a space direction on the captured image and generating a space-filtered image;
   c-22) performing a filtering process in a time direction on the captured image and generating a time-filtered image.

2. The determination method according to claim 1, wherein the step of b) comprises a step of d) determining whether a shape of the dry area at the time of enlargement is a predetermined shape.

3. The determination method according to claim 1, wherein the initial formation of the dry area in the drying process is performed by blowing a gas on the substrate.

4. The determination method according to claim 1, wherein the initial formation of the dry area in the drying process is performed by heating a predetermined position of the substrate.

5. The determination method according to claim 1, wherein the enlargement of the dry area in the drying process is performed by blowing a gas onto the substrate.

6. The determination method according to claim 1, wherein the enlargement of the dry area in the drying process is performed by gradually enlarging a heated area of the substrate.

7. The determination method according to claim 1, wherein the step of c) further comprises:
   c-13) issuing an alarm when it is determined in the step of c-12) that the opening is formed.

8. A determination method of determining quality of a drying process in equipment that executes the drying process of forming a liquid membrane on a top surface of a substrate which is held horizontally and gradually enlarging a dry area from which the liquid membrane has been removed, the determination method comprising:
   a step of a) a camera that repeatedly images the top surface of the substrate during execution of the drying process; and
   a step of b) determining whether the dry area is in a normal state based on a plurality of captured images acquired in the step of a),
   wherein the step of b) comprises a step of c) determining whether an opening is formed in the liquid membrane before the dry area is initially formed,
   wherein the step of c) comprises:
   c-21) performing a filtering process in a space direction on the captured image and generating a space-filtered image;
   c-22 performing a filtering process in a time direction on the captured image and generating a time-filtered image;
   c-23) generating a difference image between the space-filtered image and the time-filtered image; and
   c-24) determining that the opening is formed when a difference area in the difference image is equal to or greater than a predetermined threshold value.

9. A determination method of determining quality of a drying process in equipment that executes the drying process of forming a liquid membrane on a top surface of a substrate which is held horizontally and gradually enlarging a dry area from which the liquid membrane has been removed, the determination method comprising:
   a step of a) a camera that repeatedly images the top surface of the substrate during execution of the drying process; and
   a step of b) determining whether the dry area is in a normal state based on a plurality of captured images acquired the step of a),
   wherein the step of b) comprises a step of d) determining whether a shape of the dry area at the time of enlargement is a predetermined shape,
   wherein the step of d) comprises:
   d-11) sequentially generating a sequential difference image between the plurality of captured images;
   d-12) calculating roundness of a closed curve which is formed in the sequential difference image; and
   d-13) determining that the shape is abnormal when the roundness is less than a predetermined threshold value.

10. A determination method of determining quality of a drying process in equipment that executes the drying process of forming a liquid membrane on a top surface of a substrate which is held horizontally and gradually enlarging a dry area from which the liquid membrane, has been removed, the determination method comprising:
    a step of a) a camera that repeatedly images the top surface of the substrate during execution of the drying process; and
    a step of b) determining whether the dry area is in a normal state based on a plurality of captured images acquired in the step of a),
    wherein the step of b) comprises a step of d) determining whether a shape of the dry area at the time of enlargement is a predetermined shape,
    wherein the step of d) comprises:
    d-21) sequentially generating a sequential difference image between the plurality, of captured images;
    d-22) counting the number of closed curves which are formed in the sequential difference image; and d-23) determining that the shape is abnormal when the number of closed curves is equal to or greater than a predetermined threshold value.

11. A determination method of determining quality of a drying process in equipment that executes the drying process of forming a liquid membrane on a top surface of a substrate which is held horizontally and gradually enlarging a dry area from which the liquid membrane has been removed, the determination method comprising:
a step of a) a camera that repeatedly images the top surface of the substrate during execution of the drying process; and
a step of b) determining whether the dry area is in a normal state based on a plurality of captured images acquired in the step of a),
wherein the initial formation of the dry area in the drying process is performed by blowing a gas on the substrate,
wherein the drying process comprises:
a step of x) heating the substrate and forming a vapor layer between the top surface of the substrate and the liquid membrane;
a step of y) blowing a gas onto the center of the top surface of the substrate and initially forming the dry area after the step of x); and
a step of z) further blowing a gas onto the top surface of the substrate and enlarging the dry area after the step of y).

12. A substrate processing apparatus comprising:
a substrate holding unit having a disc-shaped base, which holds a substrate horizontally;
a liquid membrane forming unit having a first nozzle, which forms a liquid membrane on a top surface of the substrate which is held by the substrate holding unit;
a first drying unit having a second nozzle, which initially forms a dry area from which the liquid membrane has been removed at a predetermined position of the top surface of the substrate;
a second drying unit having a third nozzle, which gradually enlarges the dry area;
a camera that repeatedly images the top surface of the substrate; and
a determination unit implemented by a processor and that determines whether the dry area is in a normal state based on a plurality of captured images acquired by the camera,
wherein the determination unit executes a process of c) determining whether an opening is formed in the liquid membrane before the dry area is initially formed,
wherein the process of c) comprises:
a process of c-11) generating a difference image between a reference image which is an image of the substrate immediately after the liquid membrane has been formed and the captured image; and
a process of c-12) determining that the opening is formed when a difference area in the difference image is equal to or greater than a predetermined threshold value.

13. The substrate processing apparatus according to claim 12, wherein the determination unit performs a process of d) determining whether a shape of the dry area at the time of enlargement is a predetermined shape.

14. The substrate processing apparatus according to claim 12, wherein the first drying unit initially forms the dry area by blowing a gas on the substrate.

15. The substrate processing apparatus according to claim 14, further comprising a heater that heats the substrate, wherein a vapor layer is formed between the top surface of the substrate and the liquid membrane by causing the heater to heat the substrate.

16. The substrate processing apparatus according to claim 12, wherein the first drying unit initially forms the dry area by heating the predetermined position of the substrate.

17. The substrate processing apparatus according to claim 12, wherein the process of c) further comprises: a process of c-13) issuing an alarm when it is determined in the process of c-12) that the opening is formed.

18. A substrate processing apparatus comprising:
a substrate holding unit having a disc-shaped base, which holds a substrate horizontally;
a liquid membrane forming unit having a first nozzle, which forms a liquid membrane on a top surface of the substrate which is held by the substrate holding unit;
a first drying unit having a second nozzle, which initially forms a dry area from which the liquid membrane has been removed at a predetermined position of the top surface of the substrate;
a second drying unit having a third nozzle, which gradually enlarges the dry area;
a camera that repeatedly images the top surface of the substrate; and
a determination unit implemented by a processor and that determines whether the dry area is in a normal state based on a plurality of captured images acquired by the camera,
wherein the determination unit executes a process of c) determining whether an opening is formed in the liquid membrane before the dry area is initially formed,
wherein the determination unit is configured that the process of c) comprises:
a process of c-21) performing a filtering process in a space direction on the captured image and generating a space-filtered image;
a process of c-22) performing a filtering process in a time direction on the captured image and generating a time-filtered image;
a process of c-23) generating a difference image between the space-filtered image and the time-filtered image; and
a process of c-24) determining that the opening is formed when a difference area in the difference image is equal to or greater than a predetermined threshold value.

19. The substrate processing apparatus according to claim 18, wherein the second drying unit enlarges the dry area by blowing a gas onto the substrate.

20. The substrate processing apparatus according to claim 18, wherein the second drying unit enlarges the dry area by gradually enlarging a heated area of the substrate.

21. A substrate processing apparatus comprising:
a substrate holding unit having a disc-shaped base, which holds a substrate horizontally;
a liquid membrane forming unit having a first nozzle, which forms a liquid membrane on a top surface of the substrate which is held by the substrate holding unit;
a first drying unit having a second nozzle, which initially forms a dry area from which the liquid membrane has been removed at a predetermined position of the top surface of the substrate;
a second drying unit having a third nozzle, which gradually enlarges the dry area;
a camera that repeatedly images the top surface of the substrate; and a determination unit implemented by a processor and that determines whether the dry area is in a normal state based on a plurality of captured images acquired by the camera, wherein the determination unit performs a process of d) determining whether a shape of the dry area at the time of enlargement is a predetermined shape, wherein the process of d) comprises:

a process of d-11) sequentially generating a sequential difference image between the plurality of captured images;

a process of d-12) calculating roundness of a closed curve which is formed in the sequential difference image; and a process of d-13) determining that the shape is abnormal when the roundness is less than a predetermined threshold value.

22. A substrate processing apparatus comprising:

a substrate holding unit having a disc-shaped base, which holds a substrate horizontally;

a liquid membrane forming unit having a first nozzle, which forms a liquid membrane on a top surface of the substrate which is held by the substrate holding unit;

a first drying unit having a second nozzle, which initially forms a dry area from which the liquid membrane has been removed at a predetermined position of the top surface of the substrate;

a second drying unit having a third nozzle, which gradually enlarges the dry area;

a camera that repeatedly images the top surface of the substrate; and a determination unit implemented by a processor and that determines whether the dry area is in a normal state based on a plurality of captured images acquired by the camera, wherein the determination unit performs a process of d) determining whether a shape of the dry area at the time of enlargement is a predetermined shape, wherein the process of d) comprises:

a process of d-21) sequentially generating a sequential difference image between the plurality of captured images;

a process of d-22) counting the number of closed curves which are formed in the sequential difference image; and a process of d-23) determining that the shape is abnormal when the number of closed curves is equal to or greater than a predetermined threshold value.

* * * * *